United States Patent
Seki et al.

(10) Patent No.: US 9,735,201 B2
(45) Date of Patent: Aug. 15, 2017

(54) MEMORY DEVICE

(71) Applicant: Kabushiki Kaisha Toshiba, Minato-ku (JP)

(72) Inventors: Harumi Seki, Yokkaichi (JP); Takayuki Ishikawa, Yokkaichi (JP); Masumi Saitoh, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/069,540

(22) Filed: Mar. 14, 2016

(65) Prior Publication Data

US 2016/0276410 A1 Sep. 22, 2016

(30) Foreign Application Priority Data

Mar. 19, 2015 (JP) ................................. 2015-055871

(51) Int. Cl.
*H01L 23/62* (2006.01)
*H01L 27/24* (2006.01)
*H01L 45/00* (2006.01)

(52) U.S. Cl.
CPC ...... *H01L 27/2463* (2013.01); *H01L 27/2481* (2013.01); *H01L 45/085* (2013.01); *H01L 45/1233* (2013.01); *H01L 45/1253* (2013.01); *H01L 45/1266* (2013.01);
(Continued)

(58) Field of Classification Search
CPC ..... G11C 13/00–13/06; H01L 45/04–45/1213; H01L 2924/1443; H01L 27/222–27/2409
See application file for complete search history.

(56) References Cited

U.S. PATENT DOCUMENTS 8,153,488 B2 * 4/2012 Nishitani .............. H01L 27/101
257/314
2010/0181546 A1 7/2010 Yamamoto et al.
2010/0213433 A1 8/2010 Yamamoto et al.
(Continued)

FOREIGN PATENT DOCUMENTS

JP 2010-165950 7/2010
JP 2011-135050 7/2011
(Continued)

*Primary Examiner* — Cuong B Nguyen
(74) *Attorney, Agent, or Firm* — Oblon, McClelland, Maier & Neustadt, L.L.P.

(57) ABSTRACT

According to one embodiment, a memory device includes a first layer, a second layers, a third layer provided between the first layer and the second layer, and first electrodes. The first layer includes first interconnections and a first insulating portion provided between the first interconnections. The second layer includes second interconnections and a second insulating portion provided between the second interconnections. The third layer includes first and second portions including silicon oxide. The first portion is provided between the first and the second interconnections. The second portion is provided between the first and the second insulating portions. The first electrodes are provided between the first interconnections and the first portion, and include a first material. The second interconnections include a second material. The first material is easier to ionize than the second material. A density of the first portion is lower than a density of the second portion.

9 Claims, 16 Drawing Sheets

(52) U.S. Cl.
CPC .......... *H01L 45/145* (2013.01); *H01L 45/165* (2013.01); *H01L 45/1675* (2013.01)

(56) References Cited

U.S. PATENT DOCUMENTS

| | | |
|---|---|---|
| 2011/0002154 A1 | 1/2011 | Mitani et al. |
| 2012/0273743 A1 | 11/2012 | Kuboi et al. |
| 2013/0009123 A1 | 1/2013 | Tada et al. |
| 2013/0193396 A1 | 8/2013 | Nakano et al. |
| 2013/0234097 A1 | 9/2013 | Fujii et al. |
| 2014/0158967 A1 | 6/2014 | Hou et al. |
| 2015/0263277 A1* | 9/2015 | Ozawa ................ H01L 45/1226 257/5 |

FOREIGN PATENT DOCUMENTS

| | | |
|---|---|---|
| JP | 2011-238696 | 11/2011 |
| JP | 2013-157469 | 8/2013 |
| JP | 2014-116605 | 6/2014 |
| WO | WO 2010/004705 A1 | 1/2010 |
| WO | WO 2011/115188 A1 | 9/2011 |

* cited by examiner

MEMORY DEVICE

CROSS-REFERENCE TO RELATED APPLICATIONS

This application is based upon and claims the benefit of priority from Japanese Patent Application No. 2015-055871, filed on Mar. 19, 2015; the entire contents of which are incorporated herein by reference.

FIELD

Embodiments described herein relate generally to a memory device.

BACKGROUND

As a memory device, there exists a cross-point type variable resistance memory. In such a nonvolatile memory device, there has been desired a stable operation.

DETAILED DESCRIPTION

Figure 1A:
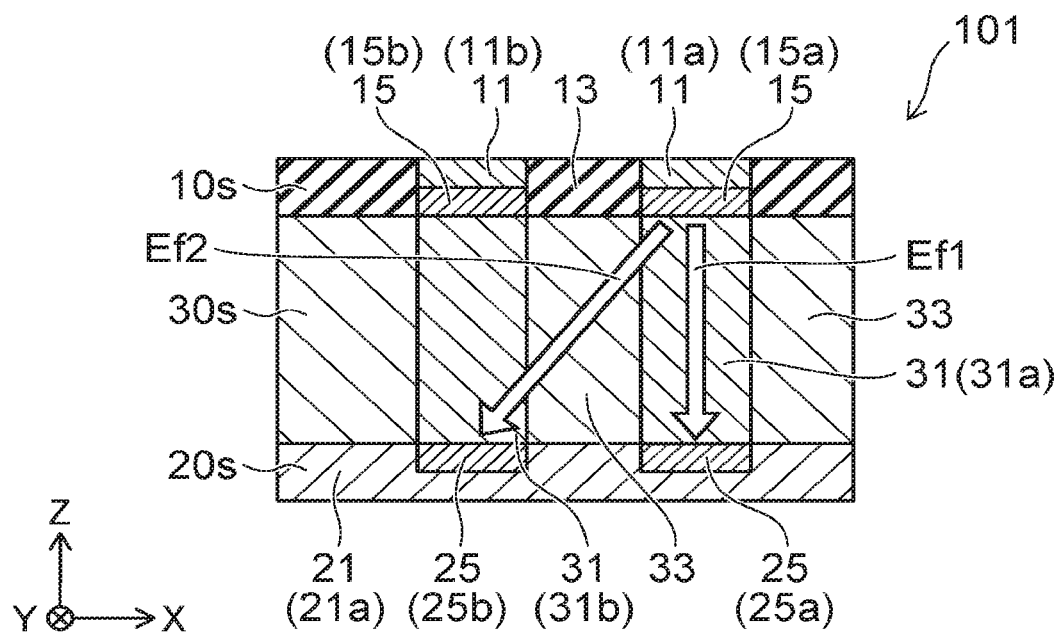
FIG. 1A and FIG. 1B are schematic cross-sectional views illustrating a memory device according to a first embodiment.

According to one embodiment, a memory device includes a first layer, a second layer, a third layer and a plurality of first electrodes. The first layer includes a plurality of first interconnections and a first insulating portion. The first interconnections extend in a first direction and are separated from each other in a direction crossing the first direction. The first insulating portion is provided between the first interconnections. The second layer is separated from the first layer in a stacking direction crossing the first direction and the direction crossing the first direction. The second layer includes a plurality of second interconnections and a second insulating portion. The second interconnections extend in a second direction crossing the first direction, and are separated from each other in a direction crossing the second direction. The second insulating portion is provided between the second interconnections. The third layer is provided between the first layer and the second layer. The third layer includes a first portion and a second portion. The first portion is provided between the first interconnections and the second interconnections, and includes a silicon oxide. The second portion is provided between the first insulating portion and the second insulating portion, and includes a silicon oxide. The first electrodes are provided between the first interconnections and the first portion. The first electrodes include a first material. The second interconnections include a second material. The first material is easier to ionize than the second material. Mass per a unit volume of the first portion is lower than mass per the unit volume of the second portion.

According to one embodiment, a memory device includes a first layer, a second layer and a third layer. The first layer includes a plurality of first interconnections and a first insulating portion. The first interconnections extend in a first direction and are separated from each other in a direction crossing the first direction. The first insulating portion is provided between the first interconnections. The second layer is separated from the first layer in a stacking direction crossing the first direction and the direction crossing the first direction. The second layer includes a plurality of second interconnections and a second insulating portion. The second interconnections extend in a second direction crossing the first direction, and are separated from each other in a direction crossing the second direction. The second insulating portion is provided between the second interconnections. The third layer is provided between the first layer and the second layer. The third layer includes a first portion and a second portion. The first portion is provided between the first interconnections and the second interconnections, and includes a silicon oxide. The second portion is provided between the first insulating portion and the second insulating portion, and includes a silicon oxide. The first interconnections include a first material. The second interconnections include a second material. The first material is easier to ionize than the second material. Mass per a unit volume of the first portion is lower than mass per the unit volume of the second portion.

According to one embodiment, a memory device includes a first layer, a second layer, a third layer and a plurality of first electrodes. The first layer includes a plurality of first interconnections and a first insulating portion. The first interconnections extend in a first direction and are separated from each other in a direction crossing the first direction. The first insulating portion is provided between the first interconnections. The second layer is separated from the first layer in a stacking direction crossing the first direction and the direction crossing the first direction. The second layer includes a plurality of second interconnections and a second insulating portion. The second interconnections extend in a second direction crossing the first direction, and are separated from each other in a direction crossing the second direction. The second insulating portion is provided between the second interconnections. The third layer is provided between the first layer and the second layer. The third layer includes a first portion and a second portion. The first portion is provided between the first interconnections and the second interconnections, and includes a silicon oxide. The second portion is provided between the first insulating portion and the second insulating portion, and includes a silicon oxide. The first electrodes are provided between the first interconnections and the first portion. The first electrodes include a first material. The second interconnections include a second material. The first material is easier to ionize than the second material. A carbon concentration in the first portion is higher than a carbon concentration in the second portion.

According to one embodiment, a memory device includes a first layer, a second layer and a third layer. The first layer includes a plurality of first interconnections and a first insulating portion. The first interconnections extend in a first direction and are separated from each other in a direction crossing the first direction. The first insulating portion is provided between the first interconnections. The second layer is separated from the first layer in a stacking direction crossing the first direction and the direction crossing the first direction. The second layer includes a plurality of second interconnections and a second insulating portion. The second interconnections extend in a second direction crossing the first direction, and are separated from each other in a direction crossing the second direction. The second insulating portion is provided between the second interconnections. The third layer is provided between the first layer and the second layer. The third layer includes a first portion and a second portion. The first portion is provided between the first interconnections and the second interconnections, and includes a silicon oxide. The second portion is provided between the first insulating portion and the second insulating portion, and includes a silicon oxide. The first interconnections include a first material. The second interconnections include a second material. The first material is easier to ionize than the second material. A carbon concentration in the first portion is higher than a carbon concentration in the second portion.

According to one embodiment, a memory device includes a first electrode, a second electrode and an intermediate layer. The first electrode includes a first material. The second electrode includes a second material. The intermediate layer is provided between the first electrode and the second electrode, and includes a first region including a first oxide of a first element. The first material is easier to ionize than the second material. A compositional ratio of oxygen in the first oxide is higher than a compositional ratio of oxygen in an oxide having a stoichiometric composition of the first element.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
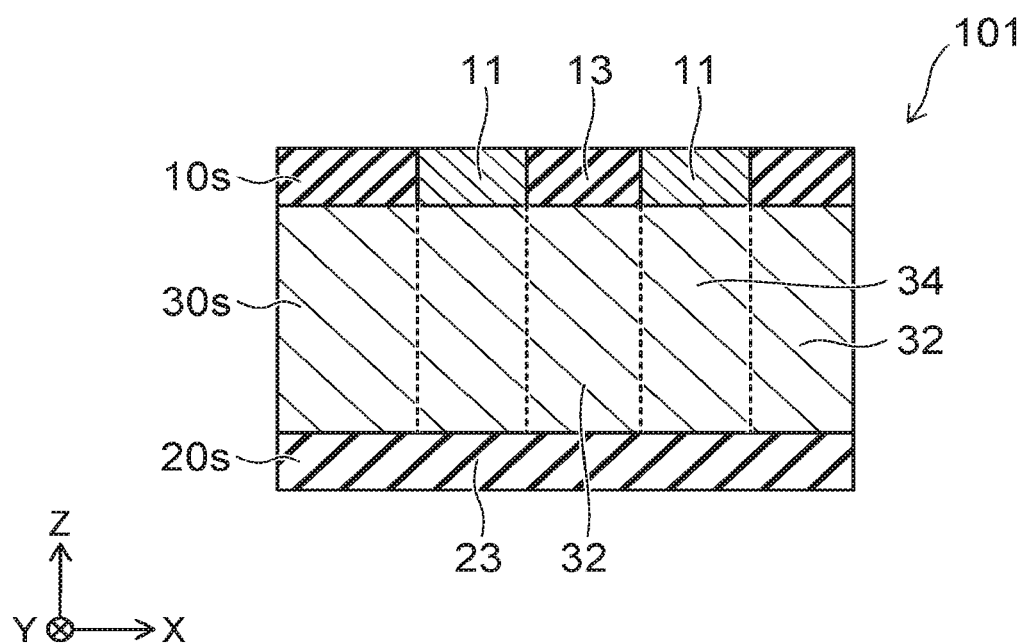

FIG. 1A and FIG. 1B are schematic cross-sectional views illustrating a memory device according to a first embodiment.

Figure 2:
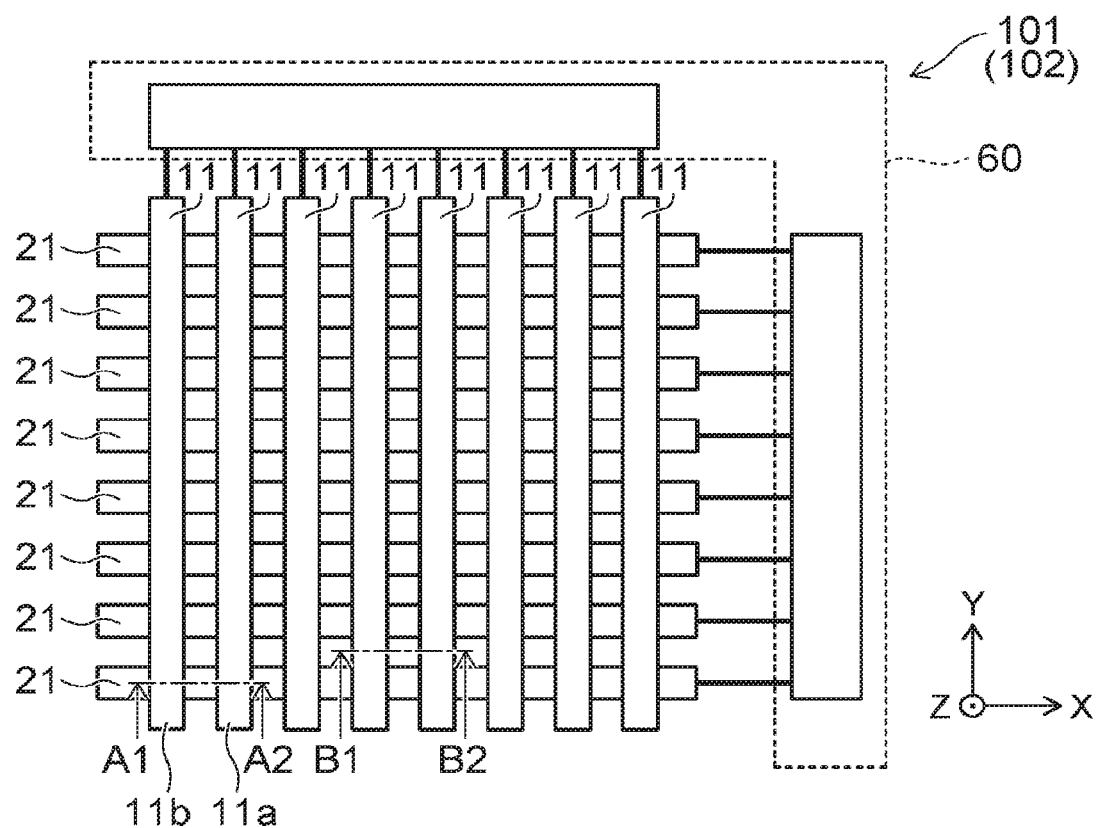
FIG. 2 is a schematic plan view illustrating the memory device according to the first embodiment.

FIG. 2 is a schematic plan view illustrating the memory device according to the first embodiment.

FIG. 1A shows a cross-sectional surface along the line A1-A2 of a memory device 101 shown in FIG. 2. FIG. 1B shows a cross-sectional surface along the line B1-B2 shown in FIG. 2.

As shown in FIG. 1A and FIG. 1B, the memory device 101 includes a first layer 10s, a second layer 20s, a third layer 30s, a plurality of first electrodes 15, and a plurality of second electrodes 25. The memory device according to the embodiment is, for example, a nonvolatile memory device.

As shown in FIG. 2, the memory device 101 can further include a control section 60. It should be noted that in FIG. 2, a first insulating portion 13, a second insulating portion 23, and the third layer 30s are omitted from the drawing for the sake of eye-friendliness.

The third layer 30s is provided between the first layer 10s and the second layer 20s.

In the specification, a direction from the first layer 10s toward the second layer 20s is defined as a Z-axis direction. One of directions perpendicular to the Z-axis direction is defined as an X-axis direction. A direction perpendicular to the X-axis direction and the Z-axis direction is defined as a Y-axis direction.

The first layer 10s includes a plurality of first interconnections 11, the first insulating portion 13, and the first electrodes 15. The first interconnections 11 each extend in a first direction (the Y-axis direction), and are separated from each other in a direction (the X-axis direction in the example) crossing the first direction.

For the first interconnections 11, there is used a conductive material. The first insulating portion 13 is provided between the first interconnections 11. As the material of the first insulating portion 13, there is used, for example, a silicon nitride.

The second layer 20s is separated from the first layer 10s in the stacking direction (the Z-axis direction in the example) crossing the X-axis direction and the Y-axis direction. The second layer 20s includes a plurality of second interconnections 21 and the second insulating portion 23.

The second interconnections 21 each extend in a second direction (the X-axis direction in the example) crossing the Y-axis direction, and are separated from each other in a direction crossing the second direction.

For the second interconnections 21, there is used a conductive material. The second insulating portion 23 is provided between the second interconnections 21. As the material of the second insulating portion 23, there is used, for example, a silicon nitride film.

The third layer 30s includes a first portion 31, second portion 32, third portion 33, and fourth portion 34.

The first portion 31 is provided between the first interconnections 11 and the second interconnections 21. The second portion 32 is provided between the first insulating portion 13 and the second insulating portion 23. The third portion 33 is provided between the second interconnections 21 and the first insulating portion 13. The fourth portion 34 is provided between the first interconnections 11 and the second insulating portion 23.

The first portion 31, the second portion 32, the third portion 33, and the fourth portion 34 each include a silicon oxide. The density (mass per unit volume) of the first portion 31 is lower than the density of each of the second portion 32, the third portion 33, and the fourth portion 34.

In the example, the density of each of the third portion 33 and the fourth portion 34 is equivalent to the density of the second portion 32. It should be noted that in the embodiment, it is also possible for the density of either of the third portion 33 and the fourth portion 34 to be equivalent to the density of the first portion 31.

The density of the first portion 31 is preferably set to, for example, not more than 2.0 g/cm$^3$. The density of the first portion 31 is, for example, not less than 1.0 g/cm$^3$ and not more than 2.0 g/cm$^3$.

A difference between the density of the first portion 31 and the density of the second portion 32 is preferably set to, for example, not less than 0.05 g/cm$^3$. The difference between the density of the first portion 31 and the density of the second portion 32 is, for example, not less than 0.05 g/cm$^3$ and not more than 1.0 g/cm$^3$.

For example, the first portion 31 through the fourth portion 34 includes voids. The proportion (proportion of the voids per unit volume) of the voids in the first portion 31 is higher than the proportion of the voids in the second portion 32. Further, the proportion of the voids in the first portion 31 is higher than the proportion of the voids in the third portion 33, and higher than the proportion of the voids in the fourth portion 34.

The first electrodes 15 are provided between the respective first interconnections 11 and the first portion 31. The first electrodes 15 each include a first material which can easily be ionized. As the easily-ionized metal element, the first material includes at least one selected from silver (Ag), copper (Cu), aluminum (Al), nickel (Ni), titanium (Ti), cobalt (Co), chromium (Cr), manganese (Mn), iron (Fe), zinc (Zn), tin (Sn), indium (In), palladium (Pd), lead (Pb), and bismuth (Bi).

The second electrodes 25 are provided between the respective second interconnections 21 and the first portion 31. The second electrodes 25 each include a second material hard to ionize. The second material is harder to ionize than the first material. The second material includes at least one selected from, for example, tungsten (W), platinum (Pt), tantalum (Ta), and molybdenum (Mo). Further, it is also possible to use a metal nitride such as a titanium nitride (TiN), a tantalum nitride (TaN), or a tungsten nitride (WN). It is also possible to use a semiconductor material such as silicon (Si) or germanium (Ge) doped with an impurity. The second electrodes 25 are preferably made of metal hard to ionize.

It should be noted that the material used for the first electrodes 15 and the material used for the first interconnections 11 can be made the same as each other to eliminate the first electrodes 15. Similarly, the material used for the second electrodes 25 and the material used for the second interconnections 21 can be made the same as each other to eliminate the second electrodes 25. By using a common material as the material of the electrodes and the material of the interconnections, it becomes possible to reduce the number of manufacturing processes.

Then, the operation of the memory device 101 will be described. The memory device is, for example, the cross-point type variable resistance memory. The variable resistance memory is a nonvolatile memory having a memory element part constituted by, for example, a two-terminal structure in which a variable resistance layer is sandwiched by two electrodes.

An end portion of each of the first interconnections 11 and an end portion of each of the second interconnections 21 are connected to the control section 60. The control section 60 controls voltages between the first interconnections 11 and the second interconnections 21. Thus, predetermined voltages are applied to the first portion 31 via the first electrodes 15 and the second electrodes 25.

The first interconnections 11 function as either one of bit lines and word lines of the memory device 101. The second interconnections 21 function as the other of the bit lines and the word lines of the memory device 101.

The electrical resistance of the first portion 31 varies in accordance with the voltage between the first interconnection 11 and the second interconnection 21. In other words, the first portion 31 functions as a plurality of cells (variable resistance memory elements, variable resistance layers) for storing information in the memory device 101.

In the memory device 101, the cells are provided respectively at positions (cross points) where the first interconnections 11 and the second interconnections 21 intersect with each other. Further, the second portion 32 through the fourth portion 34 function as an insulating portion for separating the cells from each other.

For example, as shown in FIG. 1A, the first portion 31 includes the plurality of cells (e.g., a first cell portion 31a, a second cell portion 31b) arranged in an X-Y plane.

The first cell portion 31a is electrically connected to the first interconnection 11 (an interconnection 11a) via the first electrode 15 (an electrode 15a), and is electrically connected to the second interconnection 21 (an interconnection 21a) via the second electrode 25 (an electrode 25a).

The second cell portion 31b is electrically connected to the first interconnection 11 (an interconnection 11b) via the first electrode 15 (an electrode 15b), and is electrically connected to the interconnection 21a via the second electrode 25 (an electrode 25b).

An operation in the first cell portion 31a of the first portion 31 will hereinafter be described as an example. It should be noted that operations to other cells are substantially the same.

Firstly, a writing operation will be described. By applying a writing voltage (Vset), which is positive with respect to the second electrode 25, to the first electrode 15, the writing voltage is applied to the first cell portion 31a. Thus, the metal element included in the first electrode 15 connected to the first cell portion 31a is ionized, and then precipitates in the first cell portion 31a to form a filament. Thus, the first cell portion 31a makes the transition from a high-resistance state to a low-resistance state.

Then, an erasing operation will be described. By applying an erasing voltage (Vreset), which is negative with respect to the second electrode 25, to the first electrode 15, the erasing voltage is applied to, for example, the first cell portion 31a. Thus, an electric field is generated between the second electrode 25 and the first electrode 15, and thus the filament disappears. Thus, the first cell portion 31a makes the transition from the low-resistance state to the high-resistance state.

In the case in which the second electrode 25 includes the easily-ionized metal element, the filament made of the metal included in the second electrode 25 is formed in the first cell portion 31a in some cases due to the application of the erasing voltage. In this case, it is unachievable to erase the filament in the first cell portion 31a. Therefore, it is preferable for the second electrodes 25 to be made of the metal hard to ionize.

Then, a reading operation will be described. By applying a reading voltage (Vread) between the second electrode 25 and the first electrode 15, the reading voltage is applied to the first cell portion 31a. Then, by detecting the current flowing, whether the first cell portion 31a is in the low-resistance state or in the high-resistance state is determined. An absolute value of the reading voltage is set to a value smaller than an absolute value of the writing voltage, and smaller than an absolute value of the erasing voltage.

Figure 3:
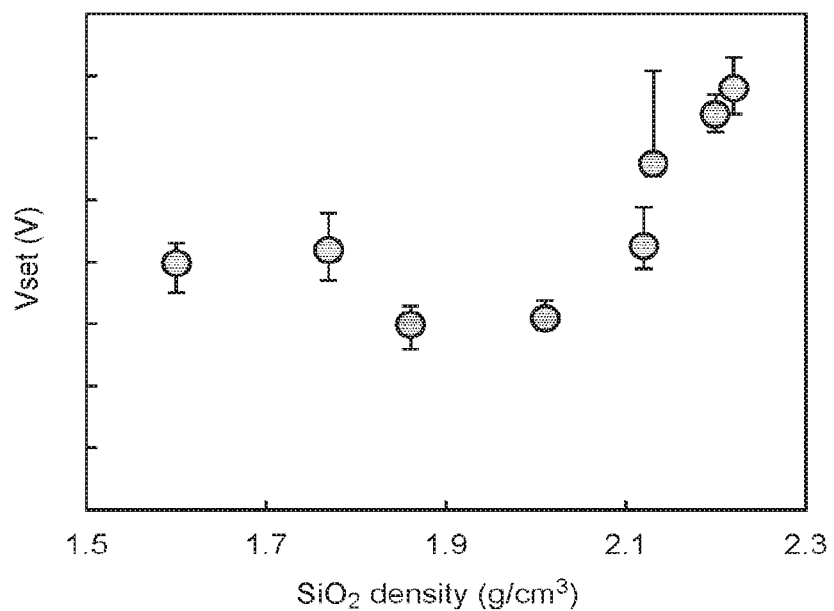
FIG. 3 is a graph chart illustrating the characteristics of the memory device.

FIG. 3 is a graph chart illustrating the characteristics of the memory device.

FIG. 3 illustrates an experimental result in the case of varying the density of the silicon oxide included in the cell in the memory element having a configuration similar to the configuration of the memory cell of the memory device 101 according to the embodiment. The elements are different in the density of the silicon oxide from each other, and the rest of the configuration such as the electrodes is common to the elements. The density of the silicon oxide can be varied by the forming conditions of the film.

The horizontal axis of FIG. 3 represents the density (g/cm$^3$) of the silicon oxide film. The vertical axis of FIG. 3 represents the writing voltage Vset (V). Here, the writing voltage Vset is a voltage at which the value of the current flowing through the cell takes a predetermined value.

As shown in FIG. 3, the operation voltage of the element having the silicon oxide film low in density as the variable resistance layer is lower than the operation voltage of the element having the silicon oxide film high in density as the variable resistance layer. In FIG. 3, in the case of using the silicon oxide film with the density higher than 2.0 g/cm$^3$, the operation voltage Vset rises as the density increases.

The cell structure of the variable resistance memory is simpler compared to other memory devices. Therefore, the scaling of the variable resistance memory is thought to be relatively easy. The variable resistance memory has attracted attention as a major candidate of a next-generation mass storage replacing the existing products such as a NAND-type flash memory widely applied as a product.

By using the cross-point type memory structure such as the memory device according to the embodiment, the mass storage can be realized using the variable resistance memory. However, in the cross-point type memory structure, there occurs the crosstalk, which is a phenomenon that an electric field is obliquely applied between the target memory cell and the adjacent cell instead of the target memory cell, in the operation such as writing in some cases.

For example, there is considered the case of performing writing in the first cell portion 31a. When applying the writing voltage between the interconnection 11a connected to the first cell portion 31a and the interconnection 21a connected to the first cell portion 31a, an electric field Ef1 is generated between the interconnection 11a and the interconnection 21a. Thus, the filament is formed in the first cell portion 31a. However, when applying the writing voltage between the interconnection 11a and the interconnection 21a, an oblique electric field Ef2 is generated between the first cell portion 31a and the adjacent cell (e.g., the second cell portion 31b). The oblique electric field Ef2 occurs between, for example, the electrode 15a and the electrode 25b. There is a concern that the silicon oxide film (the third portion 33 in the example) located between the first cell portion 31a and the adjacent cell lowers in resistance due to such a crosstalk. There is a possibility that the normal operation is hindered accordingly.

In contrast, in the embodiment, the silicon oxide film (e.g., the second portion 32) high in density is provided in the periphery of the first portion 31 as the silicon oxide film low in density. As shown in FIG. 3, if the electrode is the same, the operation voltage of the element having the silicon oxide film high in density as the variable resistance layer is higher compared to the element having the silicon oxide film low in density as the variable resistance layer. Therefore, in the memory device 101 according to the embodiment, the writing voltage of the memory cell, for example, is set to a level between the operation voltage in the second portion 32 high in density and the operation voltage in the first portion 31 low in density. Thus, it is possible to suppress the lowering in resistance of the silicon oxide film located between the cells adjacent to each other due to the oblique electric field Ef2, and thus, the crosstalk can be suppressed. Therefore, the stable operation becomes possible.

Further, the first insulating portion 13 is located between the first interconnections 11. Therefore, in the case in which the voltage is applied between the two first interconnections 11, an electric field is applied to the first insulating portion 13. On this occasion, there is a possibility that the resistance lowering is caused in the first insulating portion 13, and thus, there is a possibility that the operation of the memory device becomes unstable. In the silicon nitride film, the voltage at which the resistance lowering is caused is higher compared to the silicon oxide film. Therefore, the silicon nitride film is preferable as an interlayer insulating film for separating the interconnections. By using the silicon nitride film for the first insulating portion 13, the stable operation becomes possible. It should be noted that in the embodiment, a silicon oxide film can also be used for the first insulating portion 13. In this case, it is preferable for the density of the first insulating portion 13 to be higher than the density of the first portion 31.

Then, a method for manufacturing the memory device according to the embodiment will be described. Hereinafter, there will be described the case in which the material of the first electrode 15 and the material of the first interconnection 11 are the same, and the material of the second electrode 25 and the material of the second interconnection 21 are the same.

Figure 4A:
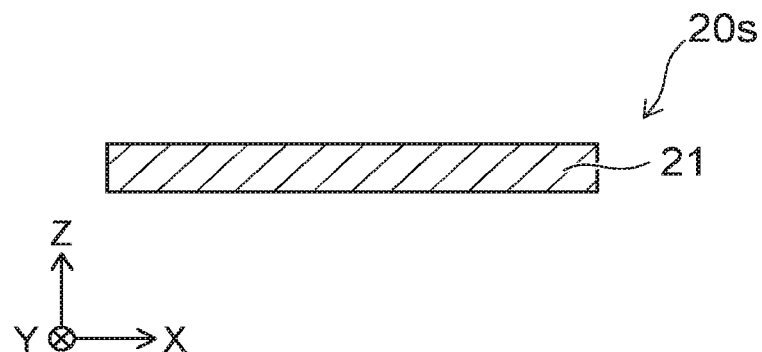
FIG. 4A and FIG. 4B are schematic views illustrating a method for manufacturing the memory device according to the embodiment.
Figure 4B:
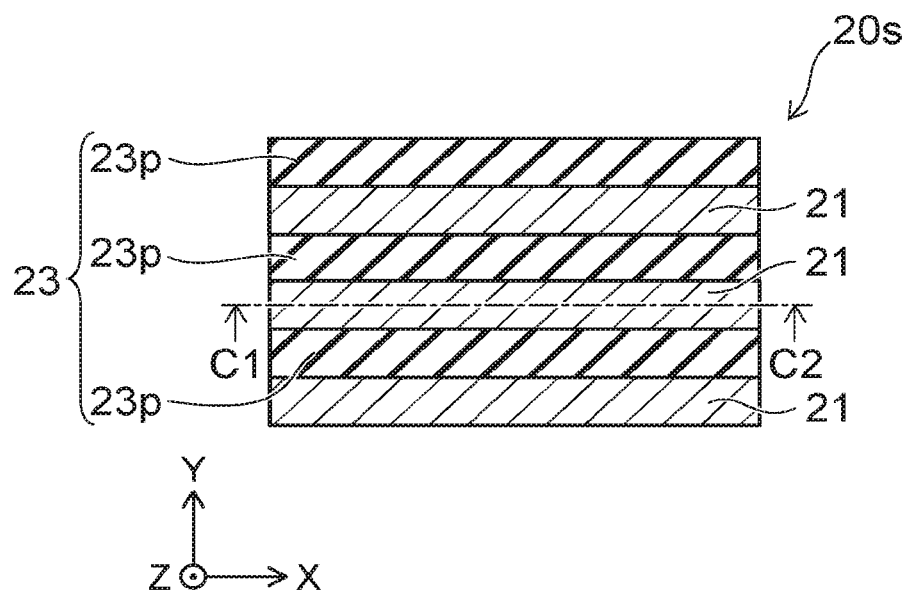

FIG. 4A and FIG. 4B are schematic views illustrating a method for manufacturing the memory device according to the embodiment. FIG. 4B is a schematic plan view, and FIG. 4A is a schematic cross-sectional view along the line C1-C2 shown in FIG. 4B.

Firstly, there is formed the second layer 20s including the plurality of second interconnections 21 and the second insulating portion 23. As shown in FIG. 4B, the second insulating portion 23 has a plurality of linear patterns. Specifically, the second insulating portion 23 includes a plurality of portions 23p extending in the X-axis direction and separated in the Y-axis direction from each other. In the second layer 20s, the second interconnections 21 and the portions 23p are arranged alternately when viewed along the Z-axis direction.

As already described above, it is preferable for the second interconnections 21 to be made of the metal hard to ionize. In the example, as the material of the second insulating portion 23, there is used a silicon nitride film.

Figure 5A:
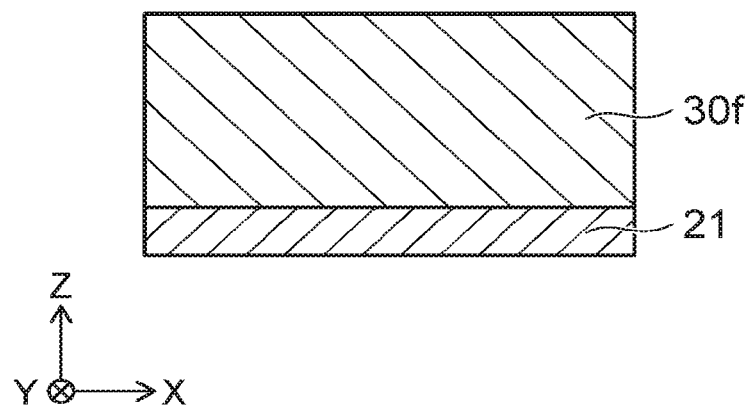
FIG. 5A and FIG. 5B are schematic views illustrating the method for manufacturing the memory device according to the embodiment.
Figure 5B:
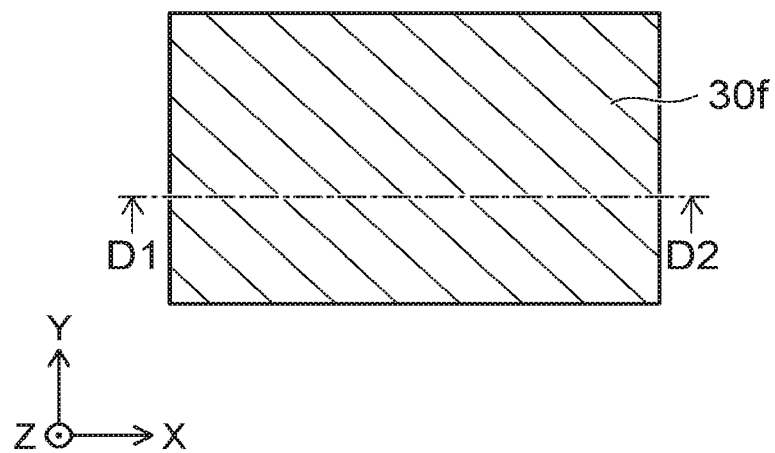

FIG. 5A and FIG. 5B are schematic views, which illustrate the method for manufacturing the memory device, and succeed FIG. 4A and FIG. 4B. FIG. 5B is a schematic plan view, and FIG. 5A is a schematic cross-sectional view along the line D1-D2 shown in FIG. 5B.

As shown in FIG. 5A and FIG. 5B, a silicon oxide film 30f high in density is formed on the second layer 20s. The silicon oxide film 30f is a film which turns to the third layer 30s. To form the silicon oxide film 30f, an ALD (Atomic Layer Deposition) method, a PECVD (Plasma Enhanced Chemical Vapor Deposition) method, or the like can be used. It is preferable for the thickness of the silicon oxide film 30f to be 3 nanometers (nm) or thicker and 10 nm or thinner.

Figure 6A:
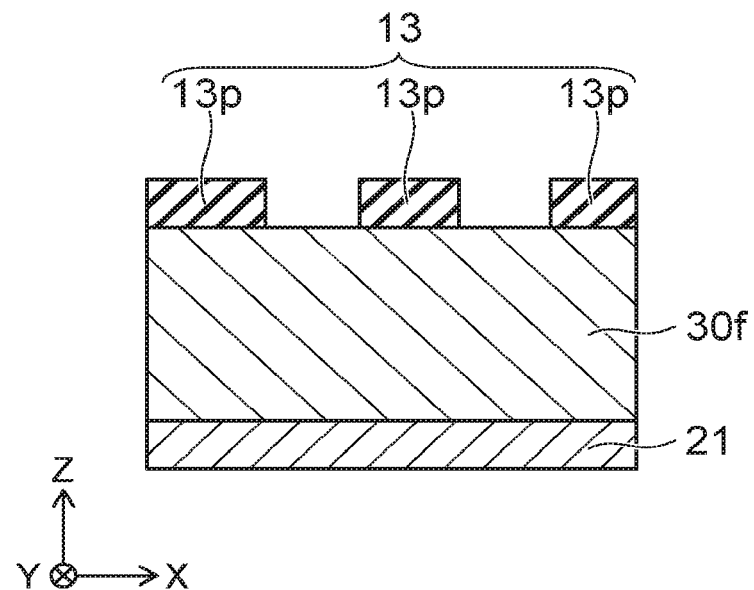
FIG. 6A and FIG. 6B are schematic views illustrating the method for manufacturing the memory device according to the embodiment.
Figure 6B:
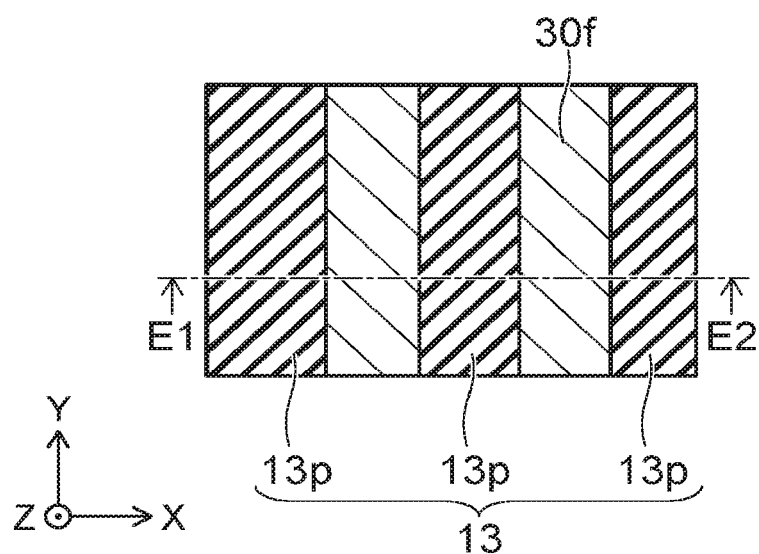

FIG. 6A and FIG. 6B are schematic views, which illustrate the method for manufacturing the memory device, and succeed FIG. 5A and FIG. 5B. FIG. 6B is a schematic plan view, and FIG. 6A is a schematic cross-sectional view along the line E1-E2 shown in FIG. 6B.

As shown in FIG. 6A and FIG. 6B, the first insulating portion 13 is formed on the silicon oxide film 30f. The first insulating portion 13 has a plurality of linear patterns parallel to each other when viewed along the Z-axis direction. Specifically, the first insulating portion 13 includes a plurality of portions 13p extending along the Y-axis direction and separated in the X-axis direction from each other. The first insulating portion 13 subsequently turns to the insulating film for filling areas between the first interconnections 11 included in the first layer 10s.

It is preferable to use a silicon nitride film for the first insulating portion 13. The silicon nitride film is higher in density compared to the silicon oxide film, and can therefore be used as a mask when performing ion implantation described later.

Figure 7A:
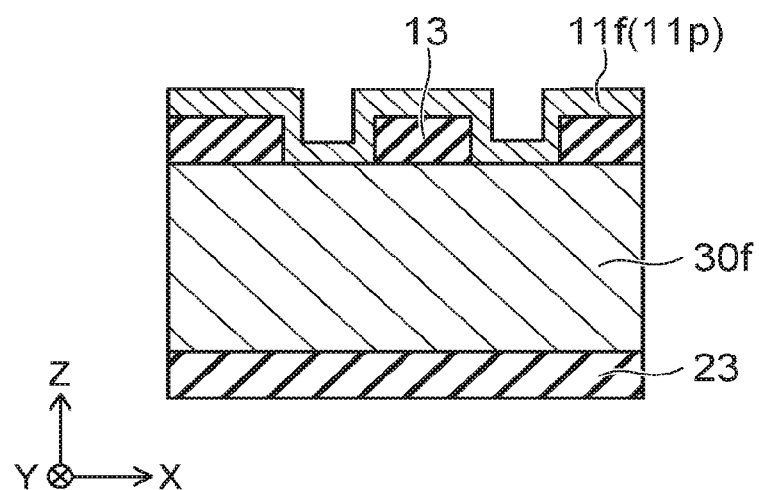
FIG. 7A and FIG. 7C are schematic views illustrating the method for manufacturing the memory device according to the embodiment.
Figure 7B:
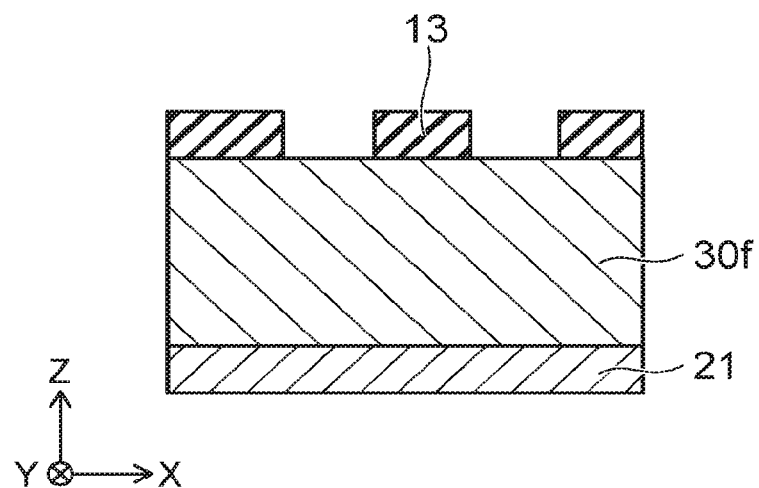
Figure 7C:
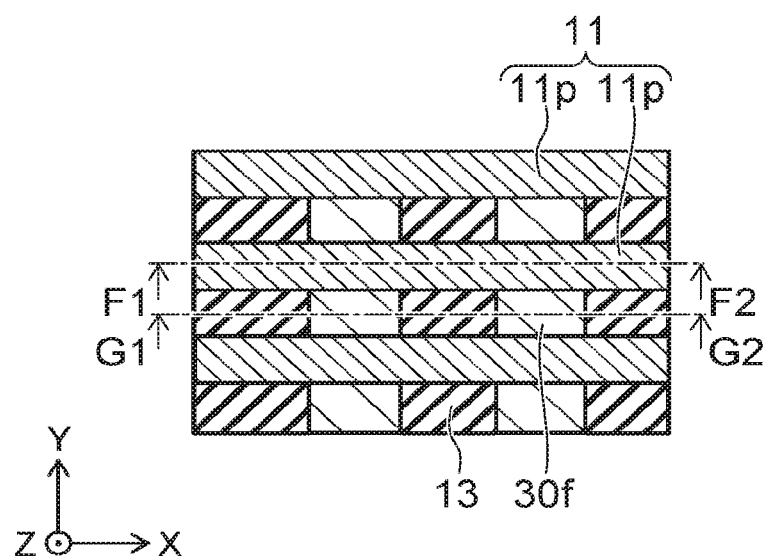

FIG. 7A through FIG. 7C are schematic views, which illustrate the method for manufacturing the memory device, and succeed FIG. 6A and FIG. 6B. FIG. 7C is a schematic plan view, and FIG. 7A is a schematic cross-sectional view along the line F1-F2 shown in FIG. 7C. FIG. 7B is a schematic cross-sectional view along the line G1-G2 shown in FIG. 7C.

As shown in FIG. 7A through FIG. 7C, a conductive film 11f is formed on the silicon oxide film 30f and the first insulating portion 13. The conductive film 11f is a film, which subsequently turns to a part of the plurality of first interconnections 11.

The conductive film 11f has a plurality of linear patterns parallel to each other when viewed along the Z-axis direction. Specifically, the conductive film 11f includes a plurality of portions 11p extending in the X-axis direction and separated in the Y-axis direction from each other.

The portions 11p are each located between the second interconnections 21, and overlap the second insulating portion 23 when projected on the X-Y plane. The width of each of the linear patterns of the conductive film 11f is roughly the same as the width of each of the linear patterns of the second insulating portion 23. Further, the intervals of the linear patterns of the conductive film 11f are roughly the same as the intervals of the linear patterns of the second insulating portion 23.

For the conductive film 11f, there is used the metal element (the first material) easily ionized described above.

Figure 8A:
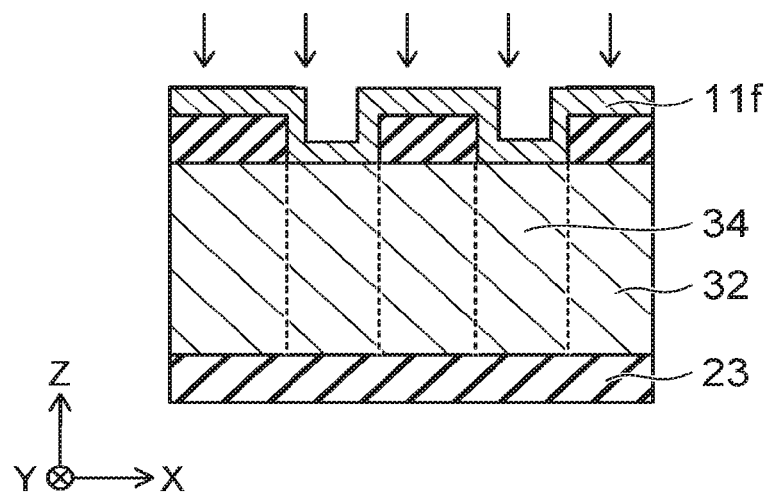
FIG. 8A to FIG. 8C are schematic views illustrating the method for manufacturing the memory device according to the embodiment.
Figure 8B:
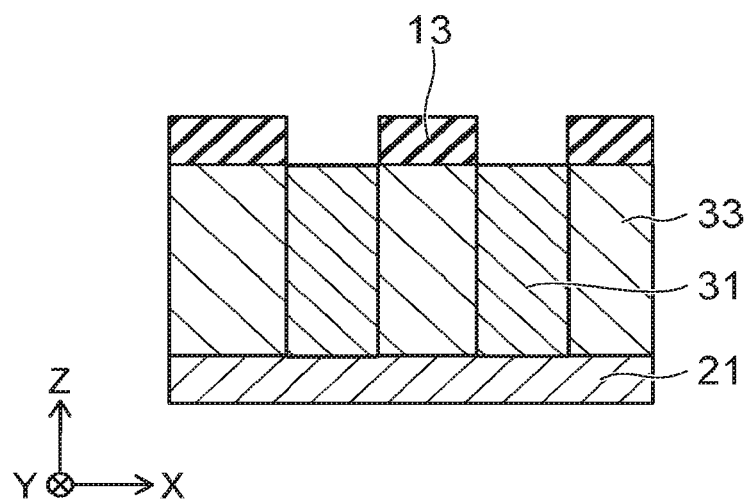
Figure 8C:
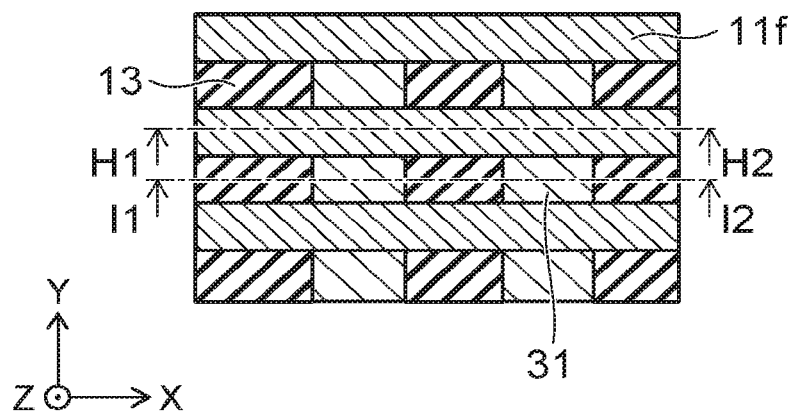

FIG. 8A through FIG. 8C are schematic views, which illustrate the method for manufacturing the memory device, and succeed FIG. 7A through FIG. 7C. FIG. 8C is a schematic plan view, and FIG. 8A is a schematic cross-sectional view along the line H1-H2 shown in FIG. 8C. FIG. 8B is a schematic cross-sectional view along the line 11-12 shown in FIG. 8C.

As shown in FIG. 8A through FIG. 8C, the silicon oxide film 30f is processed to form the third layer 30s including the first portion 31 through the fourth portion 34.

As a method of making the density of the area, which turns to the first portion 31, lower than the density of the area, which turns to the second portion 32 through the fourth portion 34, there is used a method of performing the ion implantation. By adding carbon or oxygen to the silicon oxide film 30f high in density, it is possible to lower the density of only the portion in which the ions have been implanted. By adding the element lower in weight (lower in atomic weight) than silicon, it is possible to change the composition to lower the density. Further, by implanting a rare gas element high in atomic weight, it is possible to damage the silicon oxide film 30f to thereby lower the density. Since the element implanted into the silicon oxide film 30f collides with silicon or oxygen constituting the silicon oxide film 30f to generate a void, the low density state is provided.

In the example, the ion implantation is performed on the silicon oxide film 30f from above the conductive film 11f. On this occasion, the first insulating portion 13 and the conductive film 11f act as the mask. The ions are implanted into the area (the area turning to the first part 31) not covered with the first insulating part 13 or the conductive film 11f. In such a manner, there are formed the first portion 31 low in density to which the ions are implanted, and the second portion 32 through the fourth portion 34 high in density to which the ions are not implanted.

The thicker the thickness of the first insulating portion 13 is, the more preferable, and the thicker the thickness of the conductive film 11f is, the more preferable. Thus, it becomes possible to make it difficult for the ions to be implanted into the silicon oxide films located in the lower portion of the first insulating portion 13 and the lower portion of the conductive film 11f. It is preferable for each of the thickness of the first insulating portion 13 and the thickness of the conductive film 11f to be 30 nm or thicker. Further, it is desirable for each of the density of the first insulating portion 13 and the density of the conductive film 11f to be higher than the density of the silicon oxide film 30f.

It should be noted that it is possible to use a method of forming a silicon oxide film low in density, and then increasing the density of a portion of the silicon oxide film to thereby form the second portion 32 through the fourth portion 34. The silicon oxide film low in density can be formed using a method such as plasma CVD. By adding the element higher in atomic number than the element constituting the film, such as silicon, phosphor, or germanium, to an area turning to the second portion 32 and so on of the silicon oxide film low in density, the high-density state can be created.

Figure 9A:
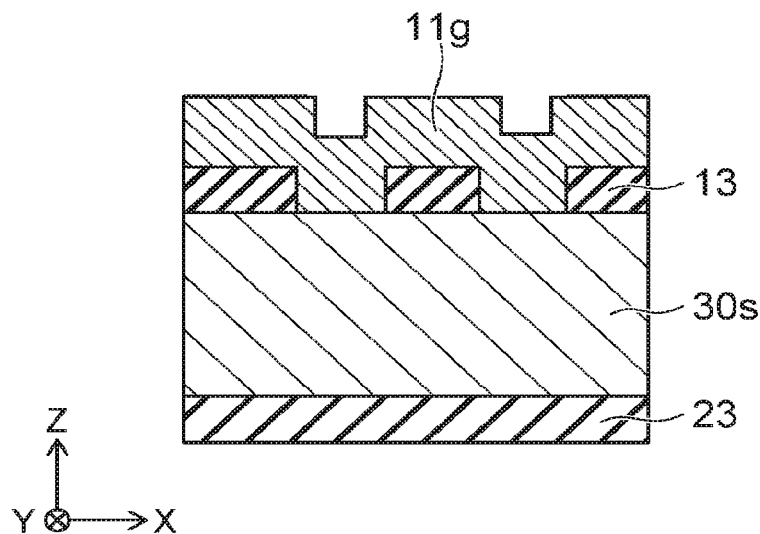
FIG. 9A to FIG. 9C are schematic views illustrating the method for manufacturing the memory device according to the embodiment.
Figure 9B:
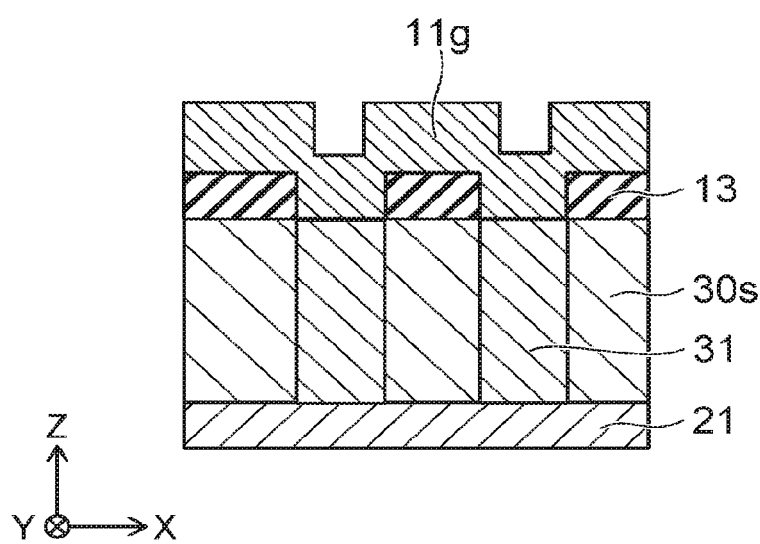
Figure 9C:
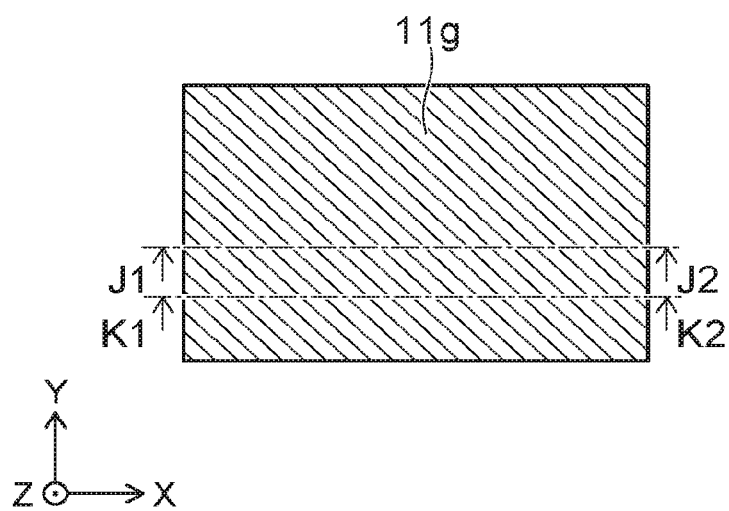

FIG. 9A through FIG. 9C are schematic views, which illustrate the method for manufacturing the memory device, and succeed FIG. 8A through FIG. 8C. FIG. 9C is a schematic plan view, and FIG. 9A is a schematic cross-sectional view along the line J1-J2 shown in FIG. 9C. FIG. 9B is a schematic cross-sectional view along the line K1-K2 shown in FIG. 9C.

As shown in FIG. 9A through FIG. 9C, a conductive film 11g is formed on the first insulating portion 13, the conductive film 11f, and the third layer 30s. Thus, gaps between the linear patterns of the first insulating portion 13 are filled. The conductive film 11g is a film, which subsequently turns to a portion of the first interconnections 11. The material used for the conductive film 11g is substantially the same as the material used for, for example, the conductive film 11f.

Figure 10A:
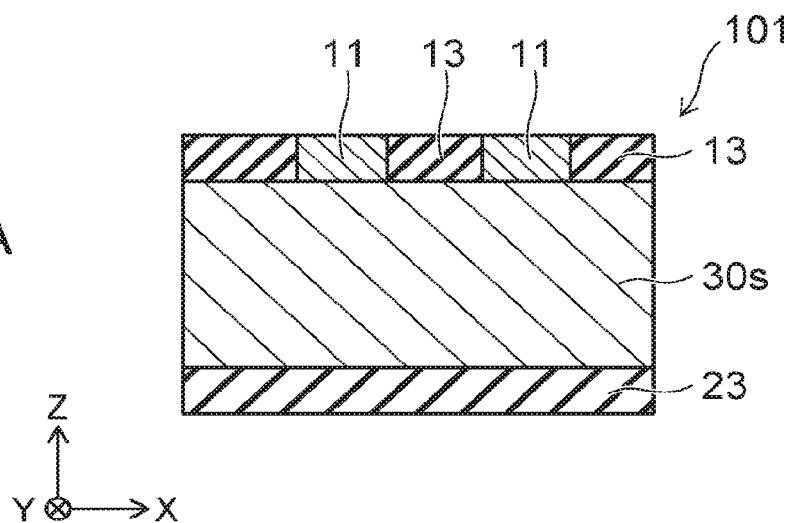
FIG. 10A to FIG. 10C are schematic views illustrating the method for manufacturing the memory device according to the embodiment.
Figure 10B:
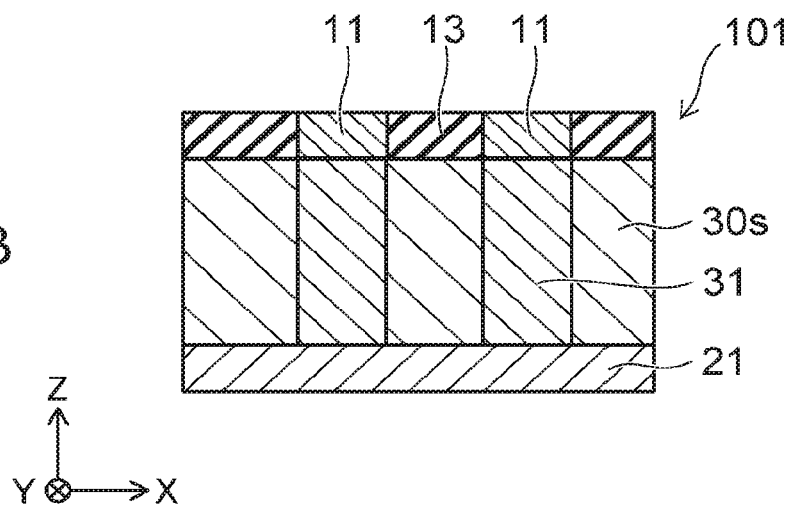
Figure 10C:
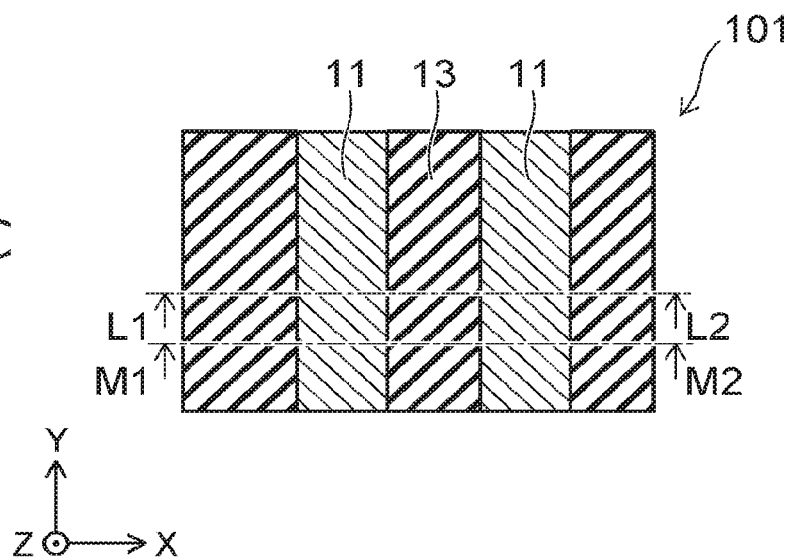

FIG. 10A through FIG. 10C are schematic views, which illustrate the method for manufacturing the memory device, and succeed FIG. 9A through FIG. 9C. FIG. 10C is a schematic plan view, and FIG. 10A is a schematic cross-sectional view along the line L1-L2 shown in FIG. 10C. FIG. 10B is a schematic cross-sectional view along the line K1-K2 shown in FIG. 10C.

As shown in FIG. 10A through FIG. 10C, a surface of the conductive film 11g (and the conductive film 11f) is planarized using CMP (Chemical Mechanical Polishing). For example, polishing is performed until the surface of the first insulating portion 13 is exposed. Thus, the first interconnections 11 are formed on the first portion 31t.

In such a manner as described above, the memory device 101 having the cross-point type memory element structure having the interconnections and the electrodes commoditized with each other is manufactured. The portion composed of the first interconnection 11, the first portion 31, and the second interconnection 21 forms one memory cell portion (a variable resistance memory element).

For example, as a method for manufacturing the memory cell portion, there is a method of a reference example to process the silicon oxide film, etc. so as to have a pillar shape. In the pillar processing, the periphery of the memory cell portion is etched. On this occasion, since there occurs the state in which a sidewall of the memory cell portion is exposed, re-deposition occurs in the sidewall in some cases. In the case in which the re-deposited object attached to the sidewall has conductivity, a leakage current flows on the sidewall of the cell to hinder the normal operation in some cases.

In contrast, in the embodiment, by performing the ion implantation after forming the silicon oxide film 30f, the variable resistance layer (the first portion 31) and the interlayer insulating film (the second portion 32) are formed separately. Therefore, the processing procedure of the sidewall portion of the cell as in the reference example does not exist. Therefore, the occurrence of the sidewall leakage due to the re-deposited object on the sidewall of the cell can be suppressed, and thus, the stable operation becomes possible.

Then, another method for manufacturing the memory device according to the embodiment will be described. In this method, the silicon oxide film high in density and the silicon oxide film low in density are formed separately using etching.

FIG. 11A through FIG. 11F are schematic cross-sectional views in the process sequence illustrating another method for manufacturing the memory device according to the first embodiment.

Figure 11A:
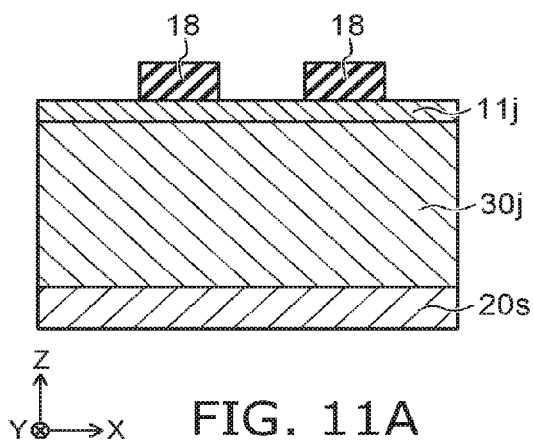
FIG. 11A to FIG. 11F are schematic cross-sectional views in the process sequence illustrating another method for manufacturing the memory device according to the first embodiment.

Firstly, as shown in FIG. 11A, the second layer 20s is formed. Then, a silicon oxide film 30j low in density is formed on the second layer 20s. The silicon oxide film 30j is a film which turns to the first portion 31 low in density. Further, a conductive film 11j is formed on the silicon oxide film 30j using an ion source electrode material (the material of the first interconnections 15). Subsequently, a resist 18 is formed on the conductive film 11j. The resist 18 has a mask pattern for masking portions turning to the memory cells at the end.

Figure 11D:
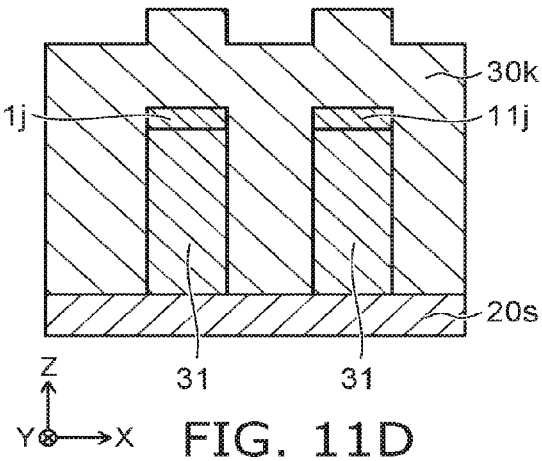
Figure 11B:
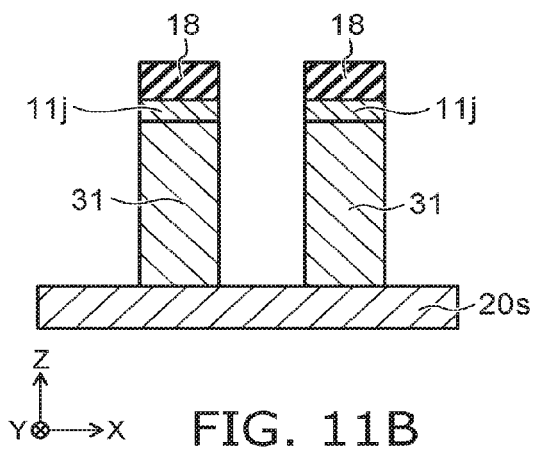

Subsequently, etching is performed using the resist 18 as a mask as shown in FIG. 11B to remove some portions of the silicon oxide film 30j low in density and some portions of the conductive film 11j, which are not masked.

Figure 11E:
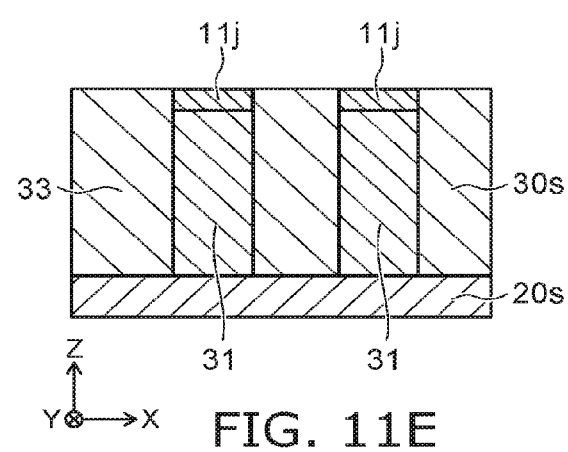
Figure 11C:
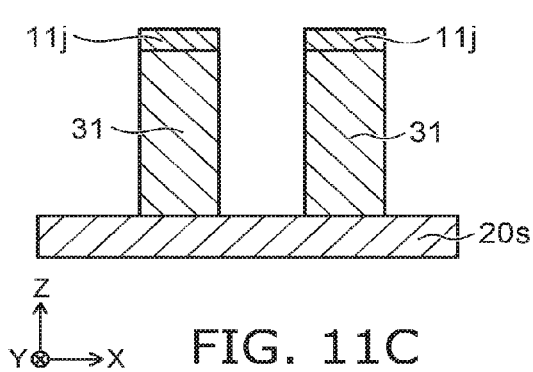

Subsequently, as shown in FIG. 11C, the resist 18 is removed. Thus, the first portion 31 is formed.

Subsequently, as shown in FIG. 11D, a silicon oxide film 30k high in density is formed on the second layer 20s, the first portion 31, and the conductive film 11j. The silicon oxide film 30k is a film which turns to the interlayer insulating film (the second through fourth portions 32 through 34). The thickness of the silicon oxide film 30k formed here is set to be thicker than the silicon oxide film 30j low in density formed in the process shown in FIG. 11A. Thus, the interlayer insulating film can be formed.

Then, as shown in FIG. 11E, the surface is polished using CMP until the conductive film 11j is exposed. Thus, there is completed the third layer 30s formed of the silicon oxide films different in density from each other.

Figure 11F:
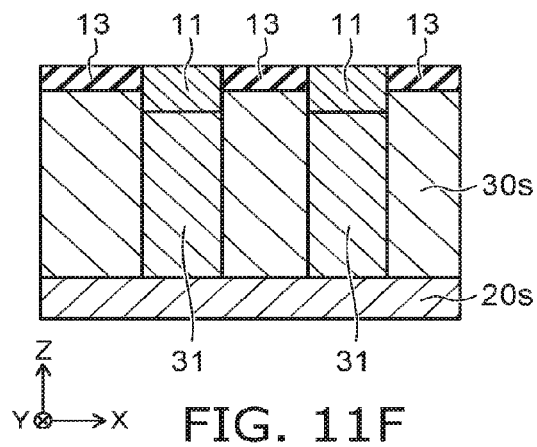

Subsequently, as shown in FIG. 11F, by forming an insulating film on the third layer 30s and then patterning the insulating film, the first insulating portion 13 is formed. Further, by forming the conductive film, and then planarizing the surface of the conductive film using CMP, the first interconnections 11 are formed. Thus, the first layer 10s is formed.

As described hereinabove, it is also possible to form the memory element by depositing two types of silicon oxide films different in density from each other besides the method of performing the ion implantation.

Second Embodiment

Figure 12A:
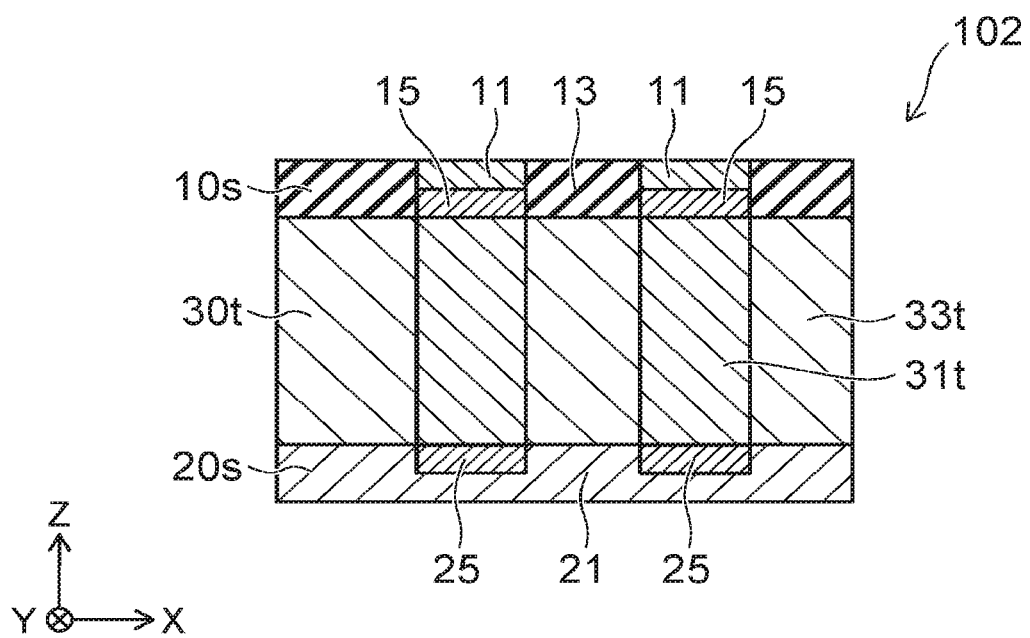
FIG. 12A and FIG. 12B are schematic cross-sectional views illustrating a memory device according to a second embodiment.
Figure 12B:
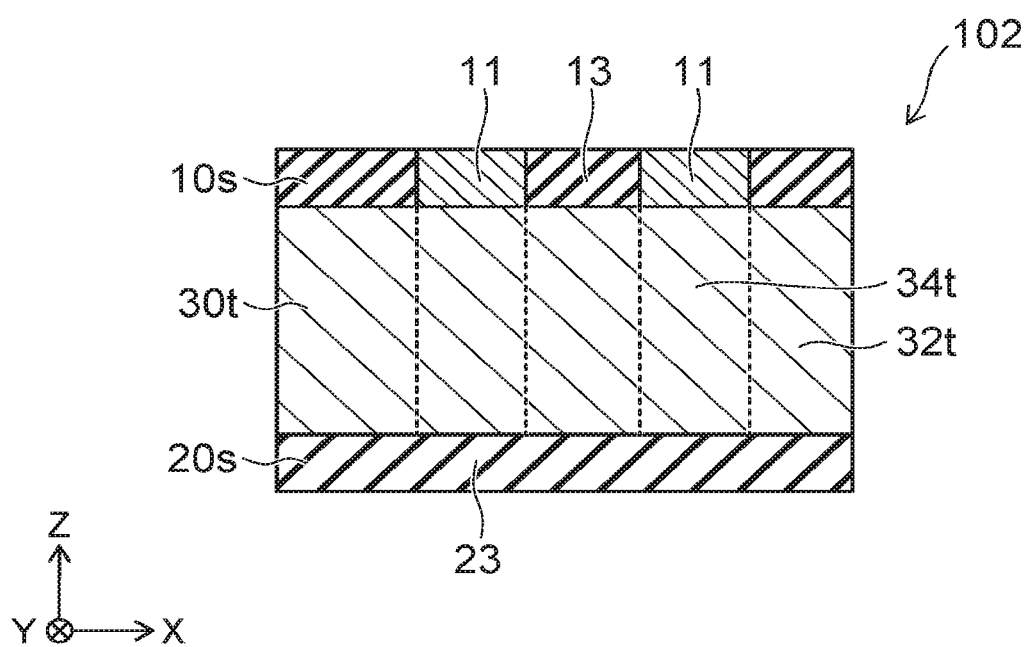

FIG. 12A and FIG. 12B are schematic cross-sectional views illustrating a memory device according to a second embodiment.

The memory device 102 according to the embodiment has substantially the same configuration as the configuration shown in FIG. 2. FIG. 12A corresponds to a cross-sectional surface along the line A1-A2 shown in FIG. 2, and FIG. 12B corresponds to a cross-sectional surface along the line B1-B2 shown in FIG. 2.

Also in the memory device 102, the first layer 10s and the second layer 20s are provided. These are substantially the same as those of the memory device 101, and therefore, the description thereof will be omitted. In the memory device 102, a third layer 30t is provided instead of the third layer 30s of the memory device 101.

The third layer 30t includes first portion 31t through fourth portion 34t.

The first portion 31t is provided between the first interconnections 11 and the second interconnections 21. The second portion 32t is provided between the first insulating portion 13 and the second insulating portion 23. The third portion 33t is provided between the second interconnections 21 and the first insulating portion 13. The fourth portion 34t is provided between the first interconnections 11 and the second insulating portion 23.

Each of the first portion 31t through the fourth portion 34t includes a silicon oxide. Further, the first portion 31t includes carbon (C).

The carbon concentration in each of the second portion 32t, the third portion 33t, and the fourth portion 34t is lower than the carbon concentration in the first portion 31t.

It is preferable for the carbon concentration in the first portion 31t to be not less than 1 atomic percent (at. %). For example, the density of the first portion 31t is not less than 1 at. % and not more than 20 at. %.

It is preferable for the carbon concentration in each of the second portion 32t through the fourth portion 34t to be lower than 1 at. %. Further, it is not required for the second portion 32t through the fourth portion 34t to include carbon.

The resistance of the first portion 31t varies in accordance with the voltage between the first interconnection 11 and the second interconnection 21. In other words, the first portion 31t functions as a plurality of cells (variable resistance memory elements, variable resistance layers) for storing information. Also in the memory device 102, the writing operation, the erasing operation, and the reading operation are performed in substantially the same manner as in the memory device 101.

Figure 13:
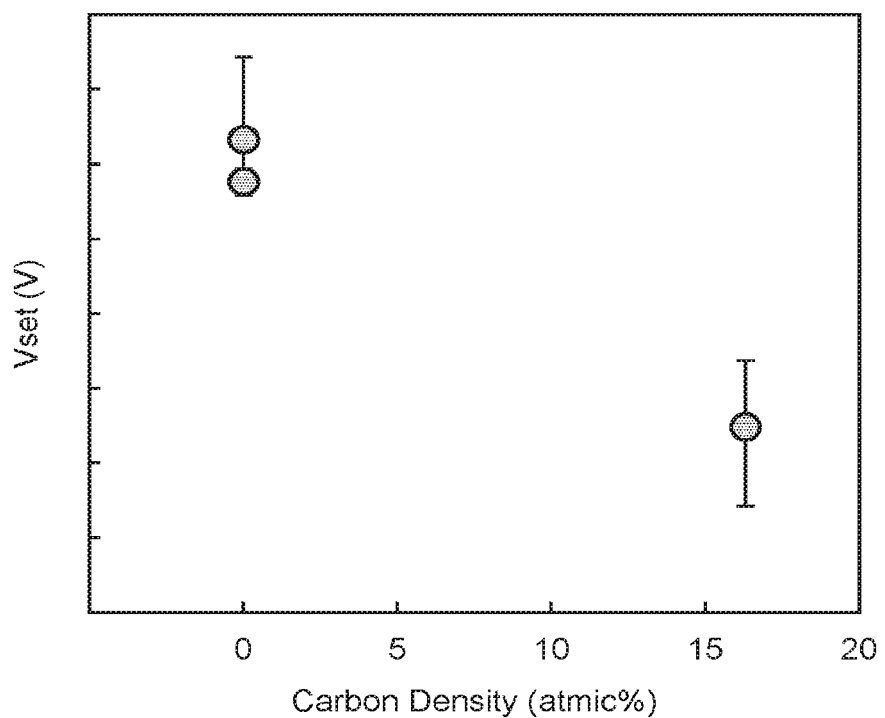
FIG. 13 is a graph chart illustrating the characteristics of the memory device.

FIG. 13 is a graph chart illustrating the characteristics of the memory device.

FIG. 13 illustrates an experimental result in the case of varying the concentration of carbon included in the cell in the memory element having a configuration similar to the configuration of the memory cell of the memory device 102 according to the embodiment. The elements are different in the carbon concentration in the silicon oxide from each other, and the rest of the configuration such as the electrodes is common to the elements. The carbon concentration can be varied by, for example, the forming conditions of the silicon oxide.

The horizontal axis of FIG. 13 represents the carbon concentration (at. %) in the silicon oxide included in the cell. The vertical axis of FIG. 13 represents the writing voltage Vset (V).

In FIG. 13, there are shown the case in which the carbon concentration is lower than 1 at. %, and the case in which the carbon concentration is approximately 16 at. %. As is understood from FIG. 13, the operation voltage of the element having the silicon oxide film high in carbon concentration as the variable resistance layer is lower than the operation voltage of the element having the silicon oxide film low in carbon concentration as the variable resistance layer.

In the embodiment, the interlayer insulating film (e.g., the second portion 32t) low in carbon concentration is provided in the periphery of the memory cell portion (the first portion 31t) high in carbon concentration. The second portion 32t is higher in operation voltage compared to the first portion 31t, and is hard to be low in resistance. Thus, it is possible to suppress the lowering in resistance of the silicon oxide film located between the cells adjacent to each other. In the memory device, the stable operation can be performed.

Further, the manufacturing of the memory device 102 can be performed similarly to the first embodiment. Specifically, by implanting carbon ions, the memory cell portion can be formed. Therefore, the re-deposited object due to etching is not generated on the sidewall of the cell, and thus, the occurrence of the leakage current can be suppressed.

Third Embodiment

Figure 14A:
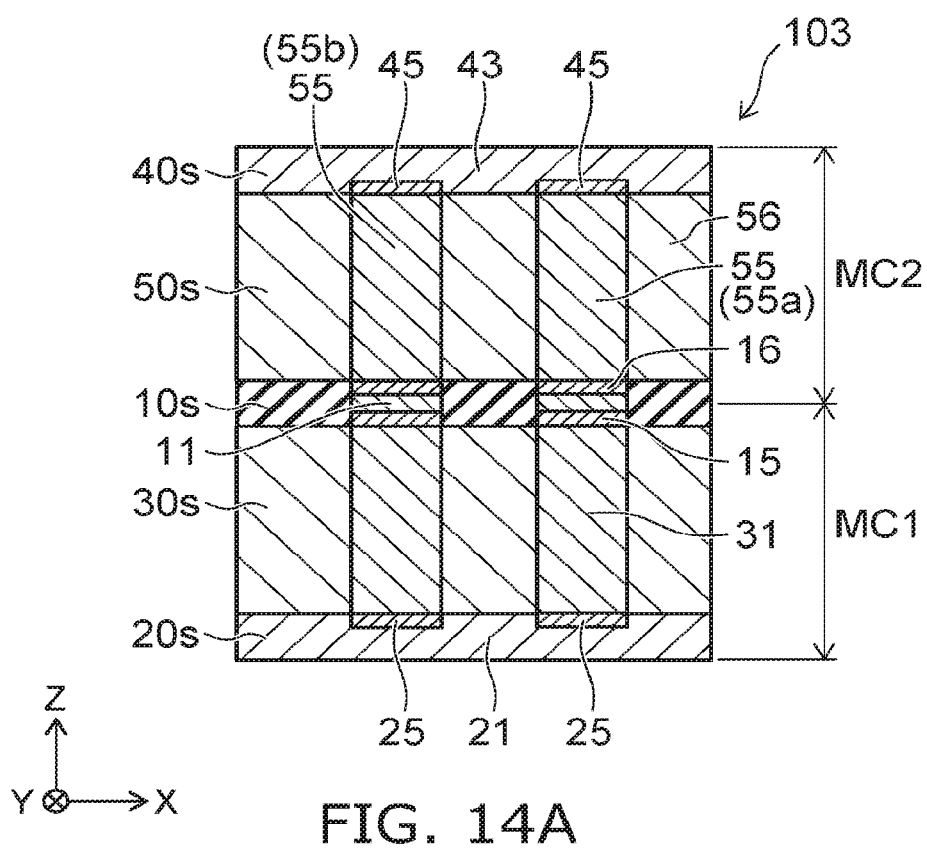
FIG. 14A and FIG. 14B are schematic cross-sectional views illustrating a memory device according to a third embodiment.
Figure 14B:
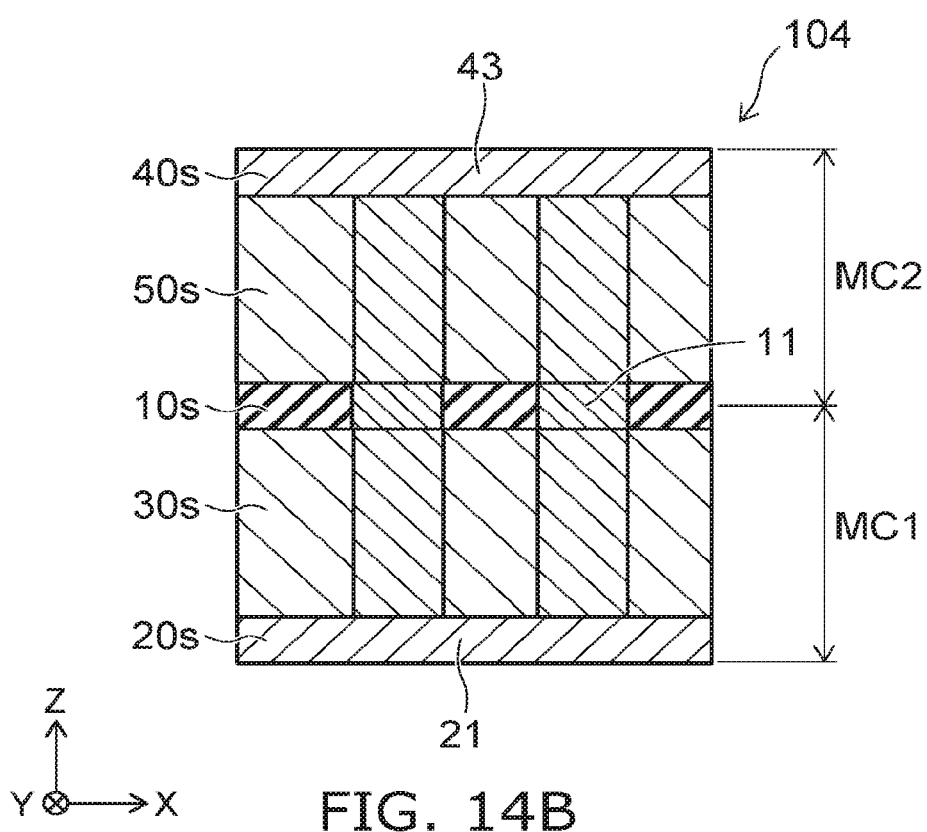

FIG. 14A and FIG. 14B are schematic cross-sectional views illustrating a memory device according to a third embodiment.

As shown in FIG. 14A, the memory device 103 includes a fourth layer 40s and a fifth layer 50s in addition to the first layer 10s, the second layer 20s, and the third layer 30s. The fifth layer 50s is provided between the fourth layer 40s and the first layer 10s.

The fourth layer 40s includes a plurality of third interconnections 43. The third interconnections 43 each extend in the X-axis direction, and are separated in the Y-axis direction from each other. Insulating films are provided between the third interconnections 43, respectively. The configuration, the material, and so on of the third interconnections 43 are substantially the same as those of the second interconnections 21.

The fifth layer 50s includes a fifth portion 55 and a sixth portion 56. The fifth portion 55 is provided between the first interconnections 11 and the third interconnections 43. The fifth portion 55 turns to a plurality of cells (variable resistance memory elements) for storing information.

The sixth portion 56 is a portion other than the fifth portion 55 out of the fifth layer 50s. The sixth portion 56 is arranged side by side with the plurality of cells (the fifth portion 55) in the X-Y plane, and is provided between the cells. The configuration, the material, and so on of the fifth portion 55 are substantially the same as those of the first portion 31. The configuration, the material, and so on of the sixth portion 56 are substantially the same as those of the second portion 32 through the fourth portion 34.

As described above, in the memory device 103, the cells for storing the information are stacked in the Z-axis direction. For example, the structure of the memory device 103 is plane symmetry about a plane passing through the first layer 10s and parallel to the X-Y plane. By repeating substantially the same processes as in the first embodiment, the memory device 103 can be manufactured.

The stacked body of the first layer 10s, the third layer 30s, and the second layer 20s is defined as a memory cell layer MC1, and the stacked body of the first layer 10s, the fifth layer 50s, and the fourth layer 40s is defined as a memory cell layer MC2. In order to operate the element of the memory cell layer MC1, a voltage is applied between the first interconnection 11 and the second interconnection 21. On this occasion, the ionized metal migrates from the first electrode 15 disposed at the position having contact with the first interconnection 11 to the first portion 31 to form the filament. Thus, the first portion 31 becomes in the low-resistance state.

In order to operate the element of the memory cell layer MC2, a voltage is applied between the first interconnection 11 and the third interconnection 43. On this occasion, the ionized metal migrates from an electrode 16 disposed at the position having contact with the first interconnection 11 to the fifth portion 55 to form the filament. Thus, the fifth portion 55 becomes in the low-resistance state.

It should be noted that in the example, the electrode 16 is provided between the first interconnection 11 and the fifth portion 55, and an electrode 45 is provided between the third interconnection 43 and the fifth portion 55. It should be noted that it is also possible to eliminate the formation of the electrode by using a common material for the interconnection material and the electrode material as in the memory device 104 shown in FIG. 14B. Further, it is also possible to form a similar layer to the third layer 30t described in the second embodiment instead of the third layer 30s or the fifth layer 50s.

The memory device according to the embodiment is capable of the stable operation similarly to the first and second embodiments. Further, by stacking the memory cell layers on one another, high integration of the memory device can be achieved.

Fourth Embodiment

Figure 15:
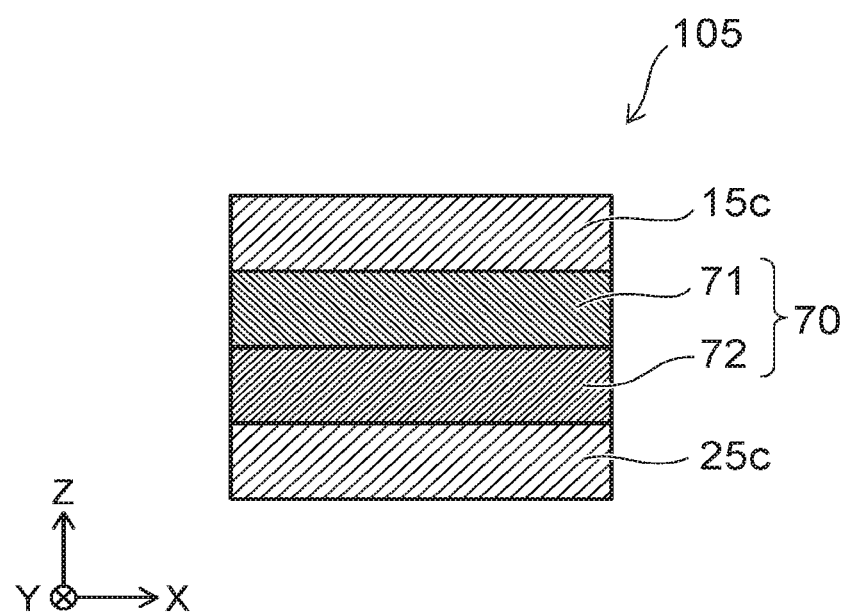
FIG. 15 is a schematic cross-sectional view illustrating a memory device according to a fourth embodiment.

FIG. 15 is a schematic cross-sectional view illustrating a memory device according to a fourth embodiment.

As shown in FIG. 15, the memory device 105 according to the embodiment includes a first electrode 15c, a second electrode 25c, and an intermediate layer 70.

The first electrode 15c includes the first material easy to ionize. The first material is at least one selected from, for example, Ag, Cu, Al, Ni, Ti, Co, Cr, Mn, Fe, Zn, Sn, In, Pd, Pb, and Bi.

The second electrode 25c includes the second material hard to ionize. The second material is harder to ionize than the first material. The second material is at least one selected from, for example, W, Pt, Ta, Mo, Si, Ge, TiN, TaN, and WN.

The intermediate layer 70 is provided between the first electrode 15c and the second electrode 25c. The intermediate layer 70 has contact with, for example, the first electrode 15c and the second electrode 25c. The intermediate layer 70 includes a first region 71 and a second region 72. In the example shown in FIG. 15, the second region 72 is provided between the first region 71 and the second electrode 25c.

The first region 71 includes an oxide (a first oxide) of a first element. The first element is, for example, one selected from hafnium and silicon. In other words, the first oxide is, for example, a hafnium oxide or a silicon oxide. It should be noted that the first oxide can also be an oxide of metal other than silicon or hafnium. As the first element, the element different from the first material is selected.

The compositional ratio of oxygen in the first oxide is higher than the compositional ratio of oxygen in the oxide having a stoichiometric composition of the first element. It should be noted that in the case in which two or more states different from each other are possible in the valence of the first element in the oxide, the oxide having the stoichiometric composition in the specification denotes the oxide in a more stable one of the states. For example, in the case in which the first element is hafnium, the oxide having the stoichiometric composition of hafnium denotes $HfO_2$. In this case, the compositional ratio between Hf and O is Hf:O=1:2. In the case in which the first element is silicon, the oxide having the stoichiometric composition of silicon denotes $SiO_2$. In this case, the compositional ratio between Si and O is Si:O=1:2.

In the case in which the first oxide in the first region 71 is a hafnium oxide, the first oxide is $HfO_x$ (x>2). For example, x is approximately 3.

Further, the density (g/cm$^3$) of the first oxide is lower than the density (g/cm$^3$) of the oxide having the stoichiometric composition of the first element. In the case in which, for example, the first element is hafnium, the density of $HfO_2$ is 9.68 g/cm$^3$. In this case, the density of the first oxide ($HfO_x$ (x>2)) in the first region 71 is lower than 9.68 g/cm$^3$.

Here, in the case in which the first oxide is $HfO_x$ (x>2), there is considered the case of making an estimation of the density of the first oxide from the compositional ratio x. Specifically, in $HfO_2$ as the stoichiometric composition, the Hf atoms are replaced with oxygen atoms in accordance with the compositional ratio x. Further, it is considered that the density varies in accordance with the mass of the element having been replaced. In the estimation, it is assumed that the volume is constant. The density of the first oxide estimated in such a manner is higher than the density of the first oxide having actually been measured.

For example, the first oxide includes voids. The proportion of the voids in the first oxide is higher than the proportion of the voids in, for example, the oxide having the stoichiometric composition of the first element.

The second region 72 includes a second oxide. The second oxide in the second region 72 can be an oxide of the same element as in the first oxide in the first region 71, or can also be an oxide of a different element from that of the first oxide in the first region 71. For example, the second oxide is an oxide of the first element. Specifically, as the second oxide, there can be used a hafnium oxide or a silicon oxide.

The second oxide is an oxide having a composition approximate to the stoichiometric composition. In the case in which both of the first oxide and the second oxide are the oxides of the first element, the compositional ratio of oxygen in the second oxide is lower than the compositional ratio of oxygen in the first oxide. In the case in which, for example, the first element is hafnium, the compositional ratio between Hf and O in the second oxide is approximately Hf:O=1:2.

In the case in which both of the first oxide and the second oxide are the oxides of the first element, the density of the second oxide is higher than the density of the first oxide. In the case in which, for example, the first element is hafnium, the density of the second oxide is approximately 9.68 g/cm$^3$.

For example, the second oxide includes voids. The proportion of the voids in the second oxide is lower than the proportion of the voids in, for example, the first oxide.

It should be noted that the intermediate layer 70 can be formed using a sputter method. By controlling the atmosphere (e.g., the flow rate of oxygen) in the formation process, the compositional ratio of oxygen in the oxide and the density of the oxide can be controlled. It should be noted that in the embodiment, the formation method of the intermediate layer 70 is not limited to the above.

In the memory device 105 described hereinabove, by applying a voltage between the first electrode 15c and the second electrode 25c, the resistance of the intermediate layer 70 (the first region 71 and the second region 72) can be varied. Thus, the intermediate layer 70 functions as a memory cell for storing information as a resistance state. In the example, the second region 72 functions as a memory layer. Then, the operation of the memory device 105 will be described.

FIG. 16A through FIG. 16E are schematic cross-sectional views illustrating operations of the memory device according to the fourth embodiment.

Figures 16A, 16B:
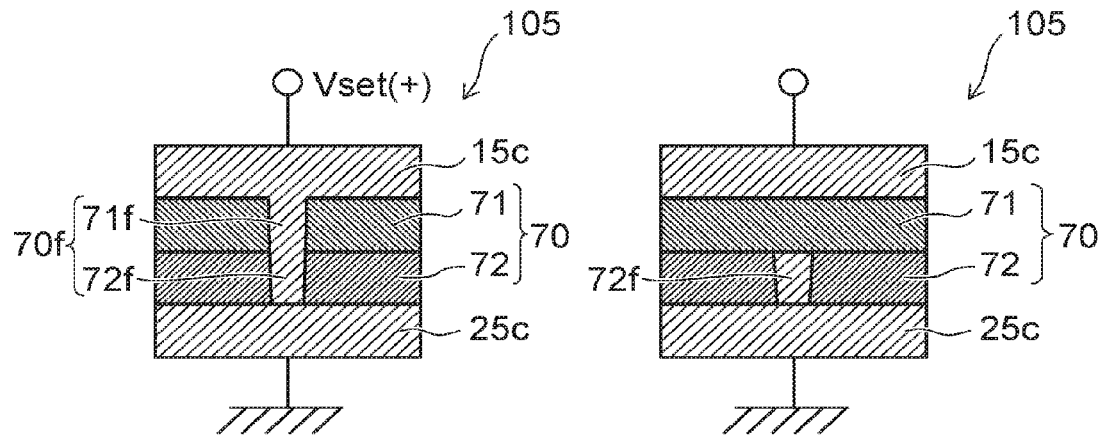
FIG. 16A to FIG. 16E are schematic cross-sectional views illustrating operations of the memory device according to the fourth embodiment.

FIG. 16A and FIG. 16B are schematic cross-sectional views illustrating the writing operation of the memory device 105. As shown in FIG. 16A, when applying a writing voltage Vset, which is positive with respect to the second electrode 25c, to the first electrode 15c, the first material included in the first electrode 15c is ionized and then precipitates. Thus, a filament 70f is formed in the intermediate layer 70. The filament 70f includes a filament 71f located in the first region, and a filament 72f located in the second region. The filament 70f forms a conductive path between the first electrode 15c and the second electrode 25c. The resistance between the first electrode 15c and the second electrode 25c lowers, and the cell becomes in the low-resistance state.

As shown in FIG. 16B, when stopping application of the writing voltage Vset, the filament 71f in the first region 71 disappears, for example, voluntarily. In contrast, even when stopping application of the writing voltage Vset, the filament 72f formed in the second region 72 does not voluntarily disappear. Therefore, the second region 72 keeps the low-resistance state.

The inventors have found out the fact that in the case in which the compositional ratio x of oxygen in the first oxide in the first region is high, the filament 71f in the first region 71 is apt to voluntarily disappear. It is conceivable that this is caused by the fact that surplus oxygen atoms randomly existing in the oxide are more easily combined with the metal element than the oxygen atoms having already been combined as, for example, the oxide. For example, the surplus oxygen atoms randomly existing in the first oxide are apt to make a combination with the metal element (the first material) forming the filament 71f when applying the writing voltage, and it becomes difficult to form a stable filament in the first region 71.

The density of the first oxide in the first region 71 is lower than the density of the oxide having the stoichiometric composition. In the low-density state, a lot of voids exist, for example, and the oxygen atoms in the oxide are distant from each other. Therefore, in the case in which atoms of the metal element (the first material) forming the filament are combined with the oxygen atoms in the first oxide, the distance between the atoms of the metal element combined with the oxygen atoms increases. Therefore, it is conceivable that the filament is relatively unstable in the first oxide.

In the first region 71 in the state in which the compositional ratio of oxygen is higher, and the density is lower than those of the stoichiometric composition, the filament becomes unstable. Therefore, it is conceivable that when stopping application of the writing voltage Vset, the first region 71 voluntarily makes the transition to the high-resistance state.

Figure 16C:
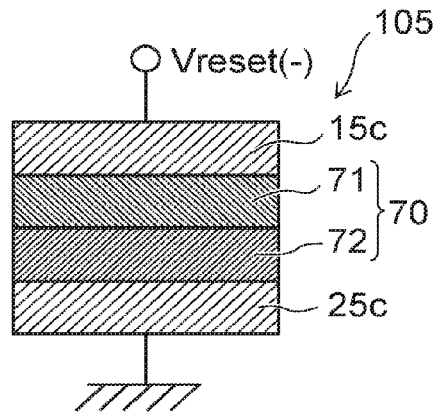

Then, the erasing operation will be described. FIG. 16C is a schematic cross-sectional view illustrating the erasing operation of the memory device 105. As shown in FIG. 16C, in order to erase the low-resistance state written in the second region 72, the voltage Vreset, which is negative with respect to the second electrode 25c, is applied. Due to the application of the voltage (Vreset), the filament existing in the second region 72 is decomposed. The second region 72 makes the transition to the high-resistance state again.

Figures 16D, 16E:
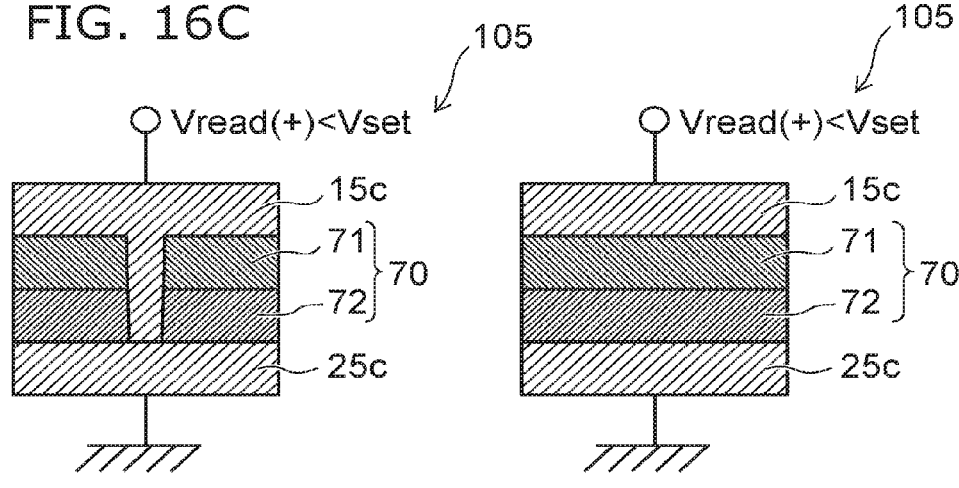

FIG. 16D and FIG. 16E are schematic cross-sectional views illustrating the reading operation of the memory device 105. When reading out the state stored in the second region 72, the reading voltage Vread, which is positive with respect to the second electrode 25c, is applied to the first electrode 15c. The reading voltage Vread is set to a voltage lower than the writing voltage Vset.

FIG. 16D illustrates the reading operation in the case in which the second region 72 is in the low-resistance state. In the case in which the second region 72 is in the low-resistance state, when applying a voltage, which is positive with respect to the second electrode 25c, to the first electrode 15c, the filament is formed again in the first region 71, and the entire cell becomes in the low-resistance state.

FIG. 16E illustrates the reading operation in the case in which the second region 72 is in the high-resistance state. In the case in which the second region 72 is in the high-resistance state, even when applying the voltage, which is positive with respect to the second electrode 25c, to the first electrode 15c, the filament is not formed. Therefore, the entire cell remains in the high-resistance state. In such a manner as described above, the states different from each other of the second region 72 can be read out using the reading voltage Vread.

The memory device 105 shown in FIG. 15 can be used for the cross-point type memory array structure similar to the first through third embodiments. In the cross-point type memory array structure, a sneak current, which is a bypass current flowing through non-selected cells, occurs in some cases in the writing operation, the reading operation, and the erasing operation. Such occurrence of the sneak current incurs an increase in the power consumption of the device, hindering of the normal operation, and so on in some cases.

In contrast, in the memory device 105 according to the embodiment, when stopping the writing voltage Vset, the filament 71f in the first region 71 disappears. Thus, the first region 71 becomes in the high-resistance state. Therefore, it is possible to suppress the sneak current flowing in the memory device 105. By providing the first region 71 having a rectifying function to the intermediate layer 70, growth in size of the device can be suppressed compared to the case of additionally providing a rectifying element such as a diode.

Figure 17:
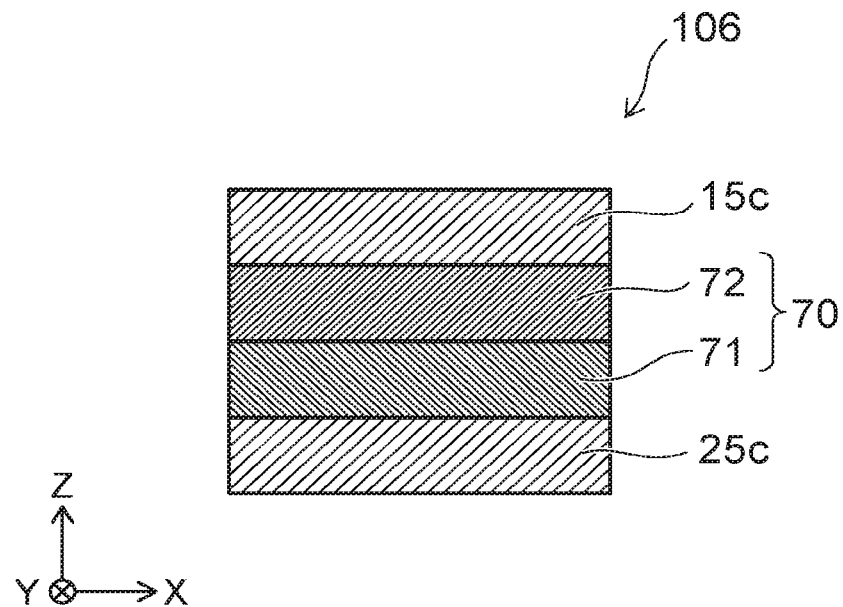
FIG. 17 is a schematic cross-sectional view illustrating another memory device according to the fourth embodiment.

FIG. 17 is a schematic cross-sectional view illustrating another memory device according to the fourth embodiment.

As shown in FIG. 17, the memory device 106 according to the embodiment is also provided with the first electrode 15c, the second electrode 25c, and the intermediate layer 70.

In the memory device 106, the second region 72 is provided between the first region 71 and the first electrode 15c. Regarding the rest of the configuration, the description similar to the description in FIG. 15 and FIGS. 16A through 16E can be applied to the memory device 106.

Also in the memory device 106, when stopping the writing voltage Vset, the filament disappears in the first region 71. Thus, the sneak current can be suppressed.

Figure 18:
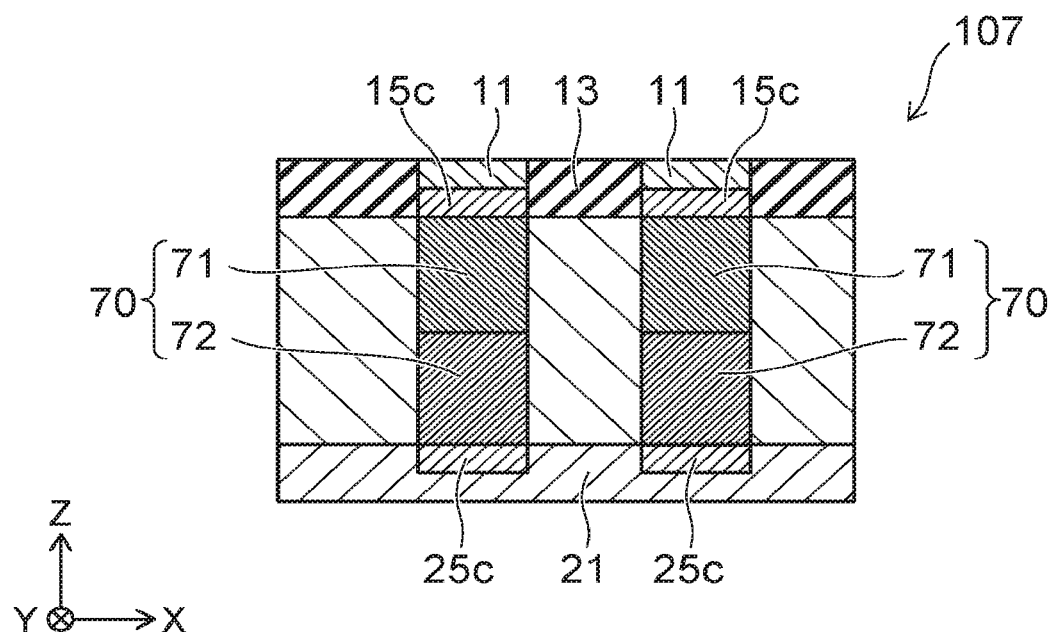
FIG. 18 is a schematic cross-sectional view illustrating another memory device according to the fourth embodiment.

FIG. 18 is a schematic cross-sectional view illustrating another memory device according to the fourth embodiment.

The memory device 107 shown in FIG. 18 is an example of applying the structure described with reference to FIG. 15 to a cross-point type memory array similar to the first embodiment. FIG. 18 corresponds to a cross-sectional surface along the line A1-A2 shown in FIG. 2.

The memory device 107 includes the plurality of first interconnections 11, the plurality of second interconnections 21, the plurality of first electrode 15c, the plurality of second electrodes 25c, and the plurality of intermediate layers 70. Each of the first interconnections 11 extends in the first direction (the Y-axis direction) crossing the stacking direction (the Z-axis direction). The first insulating portion 13 is provided between the first interconnections 11. The second interconnections 12 are separated in the stacking direction from the first interconnections 11. Each of the second interconnections 12 extends in the second direction (e.g., the X-axis direction) crossing the first direction. The second insulating portion 23 (not shown) is provided between the second interconnections 21.

The first electrodes 15c are provided between the intermediate layers 70 and the first interconnections 11, respectively. The first electrode 15c is electrically connected to the first interconnection 11, and has contact with the first interconnection 11, for example. The second electrodes 25c are provided between the intermediate layers 70 and the second interconnections 21, respectively. The second electrode 25c is electrically connected to the second interconnection 21, and has contact with the second interconnection 21, for example.

The intermediate layer 70 provided between the first electrode 15c and the second electrode 25c has the first region 71 and the second region 72 similarly to the description in the memory device 105. In the memory device 107, the intermediate layers 70 function as the memory cells arranged in the X-Y plane. In each of the memory cells, when stopping the writing voltage Vset, the filament disappears in the first region 71. Thus, in the case of incorporating the memory cells in the cross-point array structure, the sneak current can be suppressed.

It should be noted that also in the embodiment, the material used for the first interconnections 11 can also be the same as the material used for the first electrodes 15c. In other words, the first interconnections 11 can also act as the first electrodes 15*c*, respectively, and the first electrodes 15*c* can be eliminated. The material used for the second interconnections 21 can also be the same as the material used for the second electrodes 25*c*. The second interconnections 21 can also act as the second electrodes 25*c*, respectively, and the second electrodes 25*c* can be eliminated.

According to the embodiment, the memory device capable of the stable operation, and the method for manufacturing the memory device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the interconnections, the electrodes, and the insulating portions, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all memory devices and methods for manufacturing the same practicable by an appropriate design modification by one skilled in the art based on the memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a first layer including
      a plurality of first interconnections extending in a first direction and separated from each other in a direction crossing the first direction, and
      a first insulating portion provided between the first interconnections;
   a second layer separated from the first layer in a stacking direction crossing the first direction and the direction crossing the first direction, the second layer including
      a plurality of second interconnections extending in a second direction crossing the first direction, and separated from each other in a direction crossing the second direction, and
      a second insulating portion provided between the second interconnections;
   a third layer provided between the first layer and the second layer, the third layer including
      a first portion provided between the plurality of first interconnections and the plurality of second interconnections, and including a silicon oxide, and
      a second portion provided between the first insulating portion and the second insulating portion, and including a silicon oxide; and
   a plurality of first electrodes provided between the first interconnections and the first portion,
   the plurality of first electrodes including a first material,
   the plurality of second interconnections including a second material,
   the first material being easier to ionize than the second material,
   mass per a unit volume of the first portion being lower than mass per the unit volume of the second portion.

2. The device according to claim 1, wherein
   the mass per the unit volume of the first portion is not more than 2.0 (g/cm$^3$).

3. The device according to claim 1, wherein
   the third layer further includes
      a third portion provided between the plurality of second interconnections and the first insulating portion, and including a silicon oxide, and
      a fourth portion provided between the plurality of first interconnections and the second insulating portion, and including a silicon oxide, and
   the mass per the unit volume of the first portion is lower than mass per the unit volume of the third portion, and lower than mass per the unit volume of the fourth portion.

4. The device according to claim 1, wherein
   a proportion of a void per unit volume in the first portion is higher than a proportion of a void per unit volume in the second portion.

5. The device according to claim 1, wherein
   the first material includes at least one selected from Ag, Cu, Al, Ni, Ti, Co, Cr, Mn, Fe, Zn, Sn, In, Pd, Pb, and Bi.

6. The device according to claim 1, wherein
   the second material includes at least one selected from W, Pt, Ta, Mo, Si, Ge, TiN, TaN, and WN.

7. The device according to claim 1, wherein
   the first insulating portion includes a silicon nitride.

8. The device according to claim 1, wherein
   the first insulating portion includes a silicon oxide, and
   mass per the unit volume of the first insulating portion is higher than the mass per the unit volume of the first portion.

9. A memory device comprising:
   a first layer including
      a plurality of first interconnections extending in a first direction and separated from each other in a direction crossing the first direction, and
      a first insulating portion provided between the first interconnections;
   a second layer separated from the first layer in a stacking direction crossing the first direction and the direction crossing the first direction, the second layer including
      a plurality of second interconnections extending in a second direction crossing the first direction, and separated from each other in a direction crossing the second direction, and
      a second insulating portion provided between the plurality of second interconnections; and a third layer provided between the first layer and the second layer, the third layer including
- a first portion provided between the plurality of first interconnections and the plurality of second interconnections, and including a silicon oxide, and
- a second portion provided between the first insulating portion and the second insulating portion, and including a silicon oxide, the plurality of first interconnections including a first material, the plurality of second interconnections including a second material, the first material being easier to ionize than the second material, mass per a unit volume of the first portion being lower than mass per the unit volume of the second portion.

\* \* \* \* \*